United States Patent
Sawada

(10) Patent No.: US 9,374,083 B2
(45) Date of Patent: Jun. 21, 2016

(54) SWITCHING CURRENT CONTROL CIRCUIT, LED DIMMER SYSTEM, AND LED ILLUMINATION DEVICE

(75) Inventor: Akinobu Sawada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 350 days.

(21) Appl. No.: 14/003,184

(22) PCT Filed: Mar. 5, 2012

(86) PCT No.: PCT/JP2012/055542
§ 371 (c)(1),
(2), (4) Date: Sep. 4, 2013

(87) PCT Pub. No.: WO2012/121205
PCT Pub. Date: Sep. 13, 2012

(65) Prior Publication Data
US 2013/0342122 A1    Dec. 26, 2013

(30) Foreign Application Priority Data

Mar. 7, 2011 (JP) .................................. 2011-049354
Mar. 7, 2011 (JP) .................................. 2011-049357

(51) Int. Cl.
| H05B 37/00 | (2006.01) |
| H03K 17/51 | (2006.01) |
| H05B 33/08 | (2006.01) |
| H05B 37/02 | (2006.01) |

(52) U.S. Cl.
CPC ............ *H03K 17/51* (2013.01); *H05B 33/0815* (2013.01); *H05B 37/0272* (2013.01); *Y02B 20/347* (2013.01)

(58) Field of Classification Search
CPC ............................... H05B 39/04; H05B 37/00
See application file for complete search history.

(56) References Cited

U.S. PATENT DOCUMENTS 7,902,769 B2 *   3/2011   Shteynberg ........ H05B 33/0815
                                                       315/291
2007/0170874 A1   7/2007   Kunimatsu et al.

FOREIGN PATENT DOCUMENTS

| JP | 2001-008443 | 1/2001 |
| JP | 2007-194478 | 8/2007 |
| JP | 2010-110190 | 5/2010 |
| JP | 2011-040673 | 2/2011 |

OTHER PUBLICATIONS

Japanese Patent Office, International Search Report for International Patent Application PCT/JP2012/055542 (dated May 29, 2012).

* cited by examiner

*Primary Examiner* — Hai L Nguyen
(74) *Attorney, Agent, or Firm* — Fish & Richardson P.C.

(57) ABSTRACT

The switching current control circuit includes a switching pulse supply circuit, a comparator circuit, and analog circuit unit, a digital circuit unit, etc. The A/D converter (2) detects a load current in an ON period of a switching pulse as a detected current, and converts it into digital data. The arithmetic control circuit (3) calculates a lower limit of the detected current for providing a timing of switching from OFF to ON of the switching pulse, based on the converted data. Continuation/discontinuous modes are determined whether the lower limit is equal to or greater than 0.

12 Claims, 25 Drawing Sheets

(a)

(b)

<PWM DIMMING METHOD>

[CONDITIONS]
· AC VOLTAGE ON
(VHV<400mV)
[BLEEDER]
BLEEDER RESISTOR:R1(1KΩ)
(M0:On, M1:On)

[CONDITIONS]
· AC VOLTAGE IS ON, AC POWER SUPPLY IS SMALL
(VHV>=400mV&ISUP>-100mV)
[BLEEDER]
HOLDING CURRENT: $I_{HLD}=(V_{GATE}-V_f)/R2$
(M0:On, M1:Off)

[CONDITIONS]
· AC VOLTAGE IS ON,
  AC POWER SUPPLY IS LARGE
  (VHV>=400mV & ISUP ≤ -100mV)
[BLEEDER]
  HOLDING CURRENT: OFF
  (M0:Off, M1:Off)

(a)

(b)

(c)

SWITCHING CURRENT CONTROL CIRCUIT, LED DIMMER SYSTEM, AND LED ILLUMINATION DEVICE

TECHNICAL FIELD

The present invention relates to a switching current control circuit for driving load in a continuous mode, a switching current control circuit for holding a load current to a constant current value, and an LED dimmer system and an LED illumination device for preventing malfunction.

BACKGROUND ART

Conventionally, in a method for controlling a load current by switching operation to constant current, a switching pulse is turned to OFF state to control a duty cycle of ON/OFF switching when a detected current reached a predetermined level (for example, refer to Patent Literature 1).
Patent Literature 1: Japanese Patent Application Laying-Open Publication No. 2010-110190

SUMMARY OF INVENTION

Technical Problem

However, according to a switching current control circuit in the above-mentioned conventional technology, an output current Iout is changed depending on voltage drop Vin of DC power supply, voltage drop Vout of a light emitting diode, and value changes of inductance L of an inductor. For example, considering the case where a voltage value of the voltage Vin of DC power supply becomes larger, inclination of a linear part of a triangular waveform of the output current Iout will be increased depending on value changes of the output current Iout.

Since a peak current Ipk is fixed, it is switched to an OFF period of the switching operation when the output current Iout exceeds the peak current Ipk, and it is switched to an ON period of the switching operation when the output current Iout is lower than a lower-limit current value, a current waveform of the output current Iout is largely changed, the periods of ON and OFF grows shorter, and a duty cycle also grows shorter. If the ON period grows shorter too much, a period of time where a load current does not flow through a light emitting diode may occur, thereby it is may be shifted to so-called discontinuous mode (DCM).

Since the peak current Ipk is fixed, and it is switched to the OFF period when the output current Iout exceeds the peak current Ipk, the current waveform of the output current Iout is largely changed, the periods of ON and OFF grows shorter, and the duty cycle also changes. Accordingly, it is difficult to constantly make an average value of the load current.

Moreover, when LED is lit up using the above-mentioned switching current control circuit, a flicker may occur if a triac dimmer is used to perform dimming of the LED.

That is, if the holding current for the triac held by the triac dimmer becomes less than a threshold due to electric discharge of a smoothing capacitor, etc., the triac will switch to OFF state. Then, even when switching to ON state again, the triac will switch to the OFF state again due to the same reason.

Since such ON and OFF states are repeated, there is a problem of occurring a flicker which is a leading cause of discomfort for LED user.

In order to solve the problem mentioned above, the object of the present invention is to provide a switching current control circuit which can efficiently determine a continuous mode (CCM)/discontinuous mode (DCM) to lead to driving in the continuous mode (CCM) when controlling a load current by switching control.

Another object of the present invention is to provide a switching current control circuit which keeps variations of an output current of load within a predetermined range by switching control in order to not vary an average value of the output current.

Still another object of the present invention is to provide an LED dimmer system and an LED illumination device which can prevent LED flicker.

Solution to Problem

According to one aspect of the present invention for achieving the above-mentioned object, there is provided a switching current control circuit for controlling a load current flowing through a predetermined device by switching operation, the switching current control circuit comprising: a switching pulse supply circuit configured to supply a switching pulse for performing the switching operation; a comparator circuit configured to detect a load current as a detected current in an ON period of the switching pulse, and to compare the detected current with a peak current value; an A/D conversion circuit configured to detect a load current in the ON period of the switching pulse as a detected current, and to convert the detected current into digital data; and an arithmetic control circuit configured to calculate a lower limit of the detected current for providing a timing of switching the switching pulse from OFF to ON based on data of the detected current output from the A/D conversion circuit, wherein the switching current control circuit determines that it is in a continuous mode when the lower limit of the detected current calculated by the arithmetic control circuit is equal to or greater than 0, and determines that it is in a discontinuous mode when the lower limit of the detected current is a negative value.

According to another aspect of the present invention, there is provided a switching current control circuit for controlling a load current flowing through a predetermined device by switching operation, the switching current control circuit comprising: a switching pulse supply circuit configured to supply a switching pulse for performing the switching operation; a comparator circuit configured to detect a load current as a detected current in an ON period of the switching pulse, and to compare the detected current with a peak current value; and a peak current calculation circuit configured to calculate a linear increasing rate of the detected current in the ON period of the switching pulse, to calculate a maximum current value at the time of assuming that the detected current is increased until end of the ON period of switching operation using the increasing rate, and to use the maximum current value as the peak current value, wherein the switching pulse is switched to an OFF period based on an output signal of the comparator circuit when the detected current exceeds the peak current value calculated by the peak current calculation circuit.

According to still another aspect of the present invention, there is provided an LED dimmer system comprising one of the above-mentioned switching current control circuits, the LED dimmer system performing dimming of an LED, the LED dimmer system comprising: a bridge type full wave rectifying circuit connected to one end side of an AC power supply; a triac dimmer connected to other end side of the AC power supply; a bleeder resistor connected to an output side of the triac dimmer; and a bleeder control unit configured to control a current flowing through the bleeder resistor.

Advantageous Effects of Invention

According to the present invention, there can be provided a switching current control circuit which can efficiently determine a continuous mode (CCM)/discontinuous mode (DCM) to lead to driving in the continuous mode (CCM) when controlling a load current by switching control.

Moreover, according to the present invention, there can be provided a switching current control circuit which keeps variations of an output current of load within a predetermined range by switching control in order to not vary an average value of the output current.

Moreover, according to the present invention, there can be provided an LED dimmer system and an LED illumination device which can prevent LED flicker.

DESCRIPTION OF EMBODIMENTS

Figure 1:
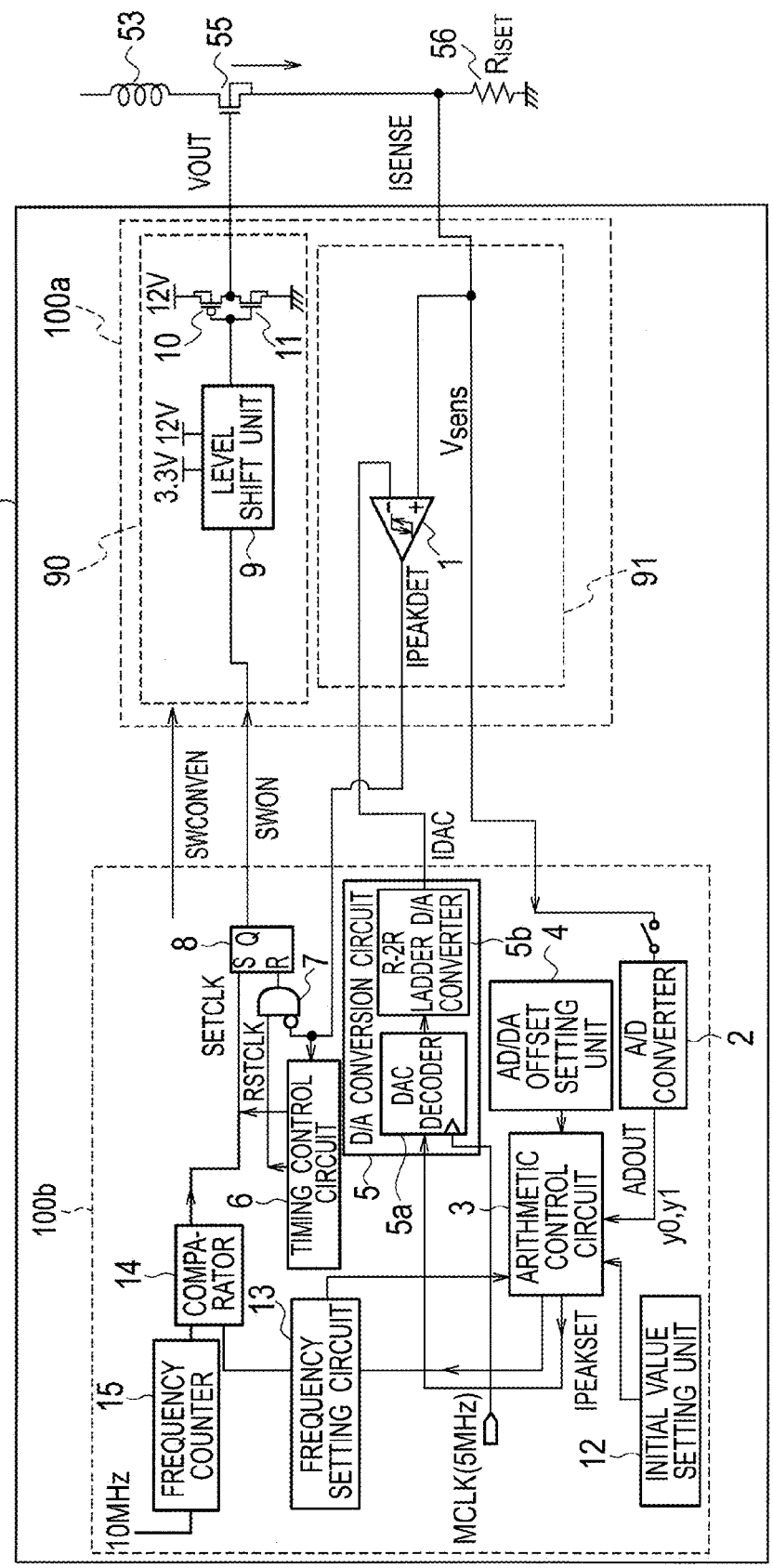
[FIG. 1] A diagram showing a circuit configuration of a switching current control circuit according to the present invention.

Next, certain embodiments of the invention will be described with reference to drawings. In the description of the following drawings, the identical or similar reference numeral is attached to the identical or similar part. However, it should be noted that the drawings are schematic and the relation between thickness and the plane size and the ratio of the thickness of each layer differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

[First Embodiment]

(Comparative Example)

Prior to an explanation of a switching current control circuit 100 according to a first embodiment, there will be explained a switching current control circuit according to a comparative example with reference to FIGS. 8 and 9.

Figure 8:
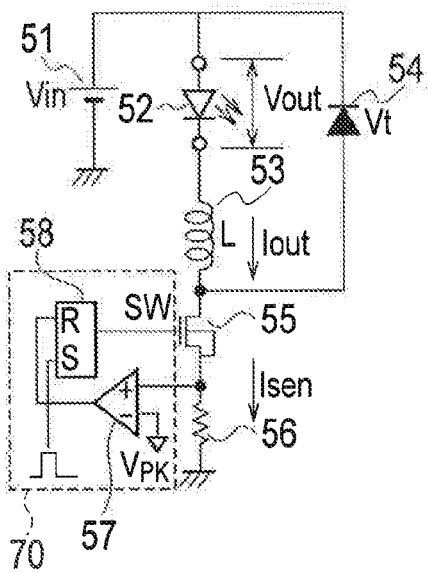
[FIG. 8] A diagram showing an example of a circuit configuration in which a conventional switching current control circuit is connected to a driving circuit of a light emitting diode.

FIG. 8 shows a circuit configuration in which a conventional switching current control circuit is connected to a driving circuit of a light emitting diode 52.

A cathode side of the light emitting diode 52 is connected to DC power supply 51, and a cathode side of the light emitting diode 52 is connected to an inductor 53. A diode 54 is disposed in parallel with the light emitting diode 52 and the inductor 53 both connected in series. A field effect transistor (FET) 55 as a switching element is connected to an anode side of the inductor 53 and the diode 54, and a current sensing resistor 56 is connected to the FET 55 in series.

There is disposed a switching current control circuit 70 used for switching control of the FET 55. The switching current control circuit 70 is composed of a comparator 57 and an RS flip-flop 58. One end of the current sensing resistor 56 is connected to a positive terminal of the comparator 57, and other end of the current sensing resistor 56 is connected to GND. An output of the comparator 57 is connected to an R terminal of the RS flip-flop 58, and an output of the RS flip-flop 58 is connected to a gate of the FET 55.

In this case, a current which flows through the light emitting diode 52 is controlled using the switching current control circuit 70. An SW1 signal in a time chart shown in FIG. 9 is an output of the RS flip-flop 58, and is an input signal to the gate of the FET 55. Iout shown in FIG. 9 corresponds to a current which flows through the light emitting diode 52 and the inductor 53. A current Isen flowing through the current sensing resistor 56 during an ON period is the same current as Iout.

Since a value of Isen is low immediately after the FET 55 is turned ON, a voltage applied on the positive terminal of the comparator 57 is low, and a voltage applied on the current sensing resistor 56 is lower than Vpk. Herein, Vpk denotes a peak voltage corresponding to a peak current (upper limit) Ipk of the current Iout which flows through the light emitting diode 52.

In this case, the output of the comparator 57 is low level and a low level signal is input into the R terminal of the RS flip-flop 58. Accordingly, if a high-level pulse signal is supplied into an S terminal, the output of RS flip-flop 58 becomes a high level signal, and thereby the ON period is continued.

However, an amount of the current Iout which flows through the light emitting diode 52 increases, with the passage of time. In this case, since an amount of the current Isen also increases, the output of the comparator 57 is shifted to high level if the voltage applied on the current sensing resistor 56 becomes higher than Vpk, and then a high level signal is supplied to the R terminal of the RS flip-flop 58. Accordingly, the output of the RS flip-flop 58 becomes a low level signal if the S terminal is in a state of low level, and therefore this period corresponds to an OFF period of the SW1 signal in FIG. 9.

During the OFF period, the FET 55 is turned OFF, and thereby a current will not flow through the FET 55 and the current sensing resistor 56. However, a closed circuit is formed of the light emitting diode 52, the inductor 53, and the diode 54. Since the current which flowed through the inductor 53 up to that time is intercepted when the FET 55 is turned OFF, a back electromotive force occurs in the inductor 53. Due to the back electromotive force of the inductor 53, the diode 54 is conducting, and then the current flows through the closed circuit of the light emitting diode 52, the inductor 53, and the diode 54. Since the back electromotive force of the inductor 53 gradually decreases, the current Iout also linearly decreases.

Figure 9:
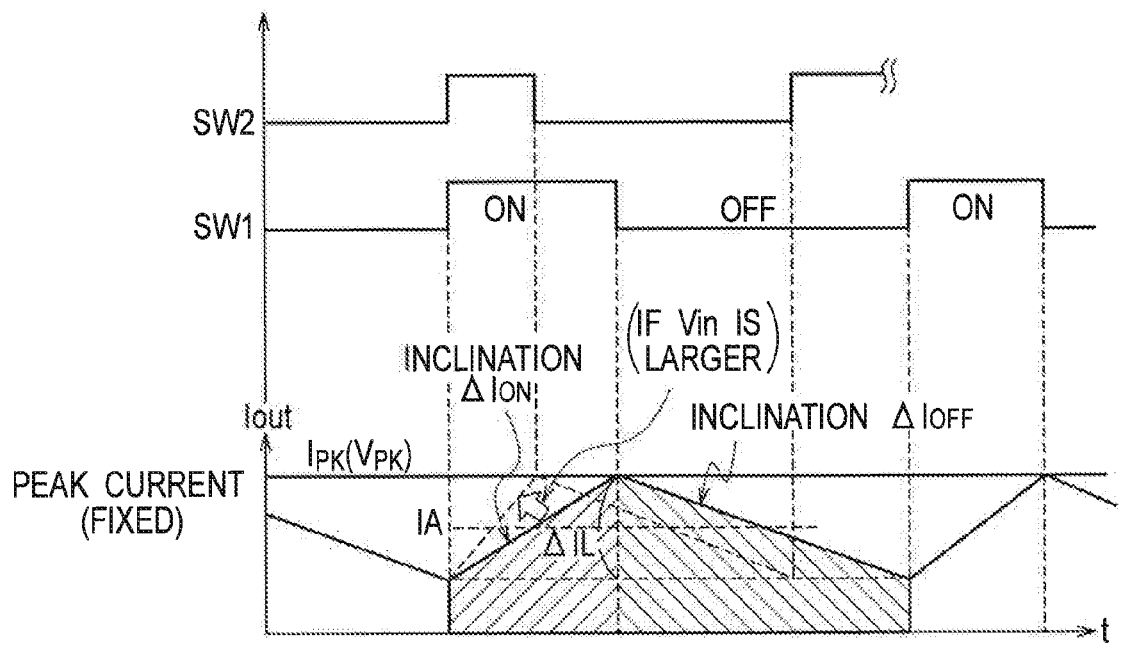
[FIG. 9] A diagram showing a load current at the time when an input voltage Vin is varied and increased in the circuit shown in FIG. 8.

If the peak current Ipk is set as shown in FIG. 9, the current Iout linearly increases during the ON period as shown in FIG. 9. Then, if the current Iout reaches Ipk, it will be switched to the OFF period. During the OFF period, since the FET 55 is tuned OFF, the current Iout linearly decreases. If the current Iout decreases up to a constant current value, it is switched to the ON period again, the current is supplied from the DC power supply 51 thereto, and thereby the current Iout linearly increases. Thus, the load current of the light emitting diode 52 is controlled, repeatedly turning ON and OFF.

As shown in FIG. 9, Iout takes the shape of triangular waveform, but the current which flows through the light emitting diode 52 is calculated with an integral value of Iout. Thereby, an average value of the current which flows through the light emitting diode 52 can be calculated. Actually, the average current of the inductor 53 is equivalent to the load current of the light emitting diode 52, and therefore an average load current IA of the light emitting diode 52 is determined by a ripple current AIL of the inductor 53. Therefore, the average current IA was calculated from an equation of IA=Ipk−(ΔIL/2), at the time of the so-called continuous mode (CCM).

However, in the switching current control circuit according to the comparative example, the output current Iout is changed depending on voltage drop Vin of the DC power supply 51, voltage drop Vout of the light emitting diode 52, and value changes of the inductance L of the inductor 53. For example, considering the case where the voltage value of Vin becomes larger, an inclination ΔION and ΔIOFF of a linear part in the triangular waveform of Iout is increased, due to change of Iout.

Since the peak current Ipk is fixed, it is switched to the OFF period of the switching operation when the output current Iout exceeds the peak current Ipk, and it is switched to the ON period of the switching operation when the output current Iout is lower than the lower-limit current value, the switching pulse becomes a pulse in the same manner as SW2. Therefore, since the current waveform of the output current Iout is largely changed as a dashed line of FIG. 9, the periods of ON and OFF grows shorter, and the duty cycle also grows shorter. If the ON period grows shorter too much, a period of time where the load current does not flow through the light emitting diode 53 may occur, thereby it may be shifted to so-called discontinuous mode (DCM).

(Switching Current Control Circuit According to First Embodiment)

As shown in FIG. 1, a switching current control circuit 100 according to the first embodiment is a switching current control circuit which controls a load current which flows through a predetermined device by switching operation.

More specifically, the switching current control circuit 100 includes: a switching pulse supply circuit 90 which supplies a switching pulse for switching operation; a comparator circuit 91 which detects a load current as a detected current in an ON period of the switching pulse, and compares the detected current with a peak current value; an A/D conversion circuit (A/D converter) 2 which detects the load current in the ON period of the switching pulse as a detected current, and converts the detected current into digital data; and an arithmetic control circuit 3 which calculates a lower limit of the detected current for providing timing of switching the switching pulse from OFF to ON based on data of the detected current output from the A/D conversion circuit 2. The switching current control circuit 100 determines that it is in a continuous mode when the lower limit of the detected current calculated by the arithmetic control circuit 3 is equal to or greater than zero, and determines that it is in a discontinuous mode when the lower limit of the detected current is a negative value.

FIG. 1 shows a structure example of the switching current control circuit 100 according to the present invention. An element(s) to which the same reference numeral is attached as FIG. 8 denotes the same circuit element. Therefore, a light emitting diode 52 is considered as an example of load, and a driving circuit portion of the light emitting diode 52 is similarly structured. More specifically, a DC power supply 51, an inductor 53, a diode 54, an FET 55, a current sensing resistor 56, etc. are connected to each other in the same manner as FIG. 8.

The switching current control circuit 100 is composed of an analog circuit unit 100a and a digital circuit unit 100b. The analog circuit unit 100a is composed of a switching pulse supply circuit 90 and a comparator circuit 91. The comparator circuit 91 is composed of a comparator 1. The switching pulse supply circuit 90 is composed of a level shift unit 9, an FET 10 which is P-channel MOS, and an FET 11 which is N-channel MOS, etc. A gate of the FET 10 and a gate of the FET 11 are connected to each other, a drain of the FET 11 is connected with a source of the FET 10, and an inverter is composed of the FET 10 and the FET 11.

The digital circuit unit 100b is composed of an A/D converter 2, an arithmetic control circuit 3, an AD/DA offset setting unit 4, a D/A conversion circuit 5, a timing control circuit 6, a logic circuit 7, an RS flip-flop 8, an initial value setting unit 12, a frequency setting unit (frequency setting circuit) 13, a comparator 14, and a frequency counter 15.

Figure 2:
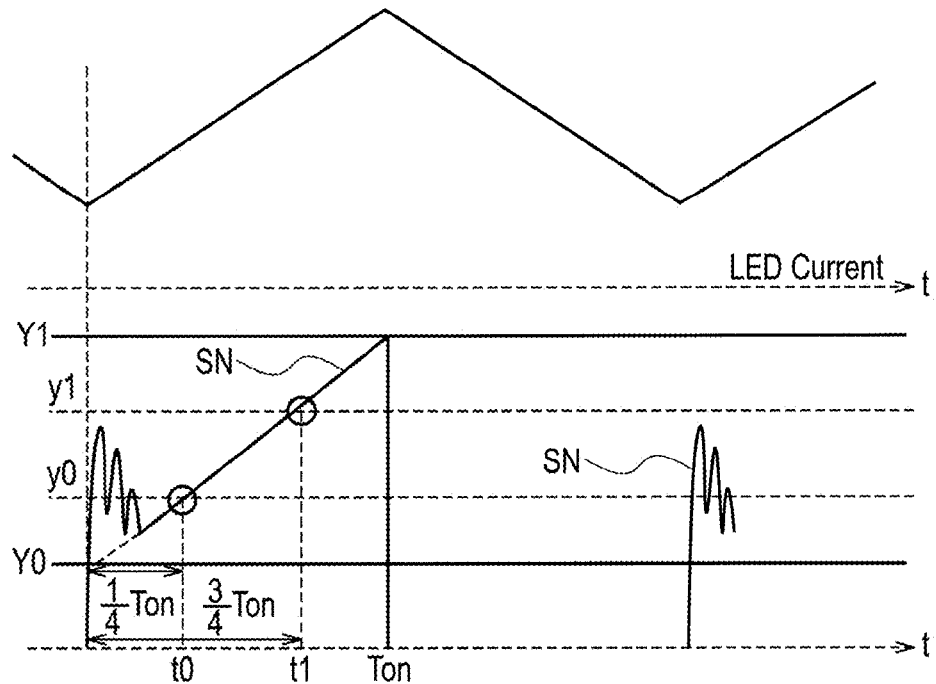
[FIG. 2] A diagram regarding a determination method of a discontinuous mode/continuous mode in the switching current control circuit according to the present invention.

FIG. 2 shows how a current which flows through the light emitting diode 52 is controlled by the switching current control circuit 100 shown in FIG. 1. An upper part of FIG. 2 shows change of the load current which flows through the light emitting diode 52. On the other hand, a lower part of FIG. 2 shows change of the current Isen which flows through the current sensing resistor 56. During ON period of switching operation (switching pulse), the current Isen becomes the same current as a current which flows through the light emitting diode. However, since the FET 55 is turned OFF during the OFF period of the switching pulse, the current Isen is 0. A graph SN shown in FIG. 2 shows such a state of the current Isen.

When SN is switched from OFF to ON by the switching operation of the FET 55, a switching noise is produced as shown in FIG. 2. Data of the SN is sampled in the ON period at the two time points t0 and t1 so that the switching noise period is avoided. The SN data at the time of t0 is set to y0, and the SN data at the time of t1 is set to y1.

In FIG. 2, Y1 is a value set up by the initial value setting unit 12, Y1 is a peak current value (upper-limit current value) of the load current or detected current, and Y0 is a lower-limit current value of the load current. ON period in a period of turning ON and OFF is set as Ton, based on an initially setting peak current value Y1 and constant frequency. In this case, $t0=Ton\times 1/4$, and $t1=Ton\times 3/4$ are realized. A current value of Isen in t0 is y0, and a current value of Isen in t1 is y1. An inclination SL of a straight line part of SN (Isen) can be calculated based on the above-mentioned data. The inclination SL corresponds to an increasing rate of the current Isen, and also corresponds to an increasing rate of the current which flows through the light emitting diode 52. Next, there is described a method for determining whether it is a discontinuous mode or not based on the above-mentioned data in the arithmetic control circuit 3.

The inclination $SL=(y1-y0)/(t1-t0)$ is realized.

Next, $ym=(y0+y1)/2$, and the lower limit $Y0=ym+SL\times Ton\times(1/2)-SL\times Ton$ are realized, where an average of y1 and y0 is ym.

In other words, lower limit $Y0=ym-SL\times Ton\times(1/2)$ is realized.

Since $t1-t0=Ton\times(1/2)$ is realized, the equation of the above-mentioned SL is expressed as $SL=2\times(y1-y0)/Ton$.

Accordingly, $Y0=ym-SL\times Ton\times(1/2)=ym-(y1-y0)$ is realized.

$Y0=((y0+y1)/2)-(y1-y0)=(3y0-y1)/2$ is realized.

In this case, when the switching current control is not in the discontinuous mode (DCM), the above-mentioned lower limit Y0 is equal to or greater than 0.

Accordingly, $(3y0-y1)/2>=0$ is realized, and then it is shifted to the continuous mode (CCM) or a critical mode (BCM) at the time of $y1<=3y0$. On the contrary, in the case of $y1>3y0$, it is shifted to the discontinuous mode.

Moreover, when determining that it is in the discontinuous mode based on the above-mentioned criterion, the lower limit Y0 can be equal to or greater than 0 by increasing the switching frequency. In this manner, it can be made to return to the pulsed continuous mode.

Figure 3:
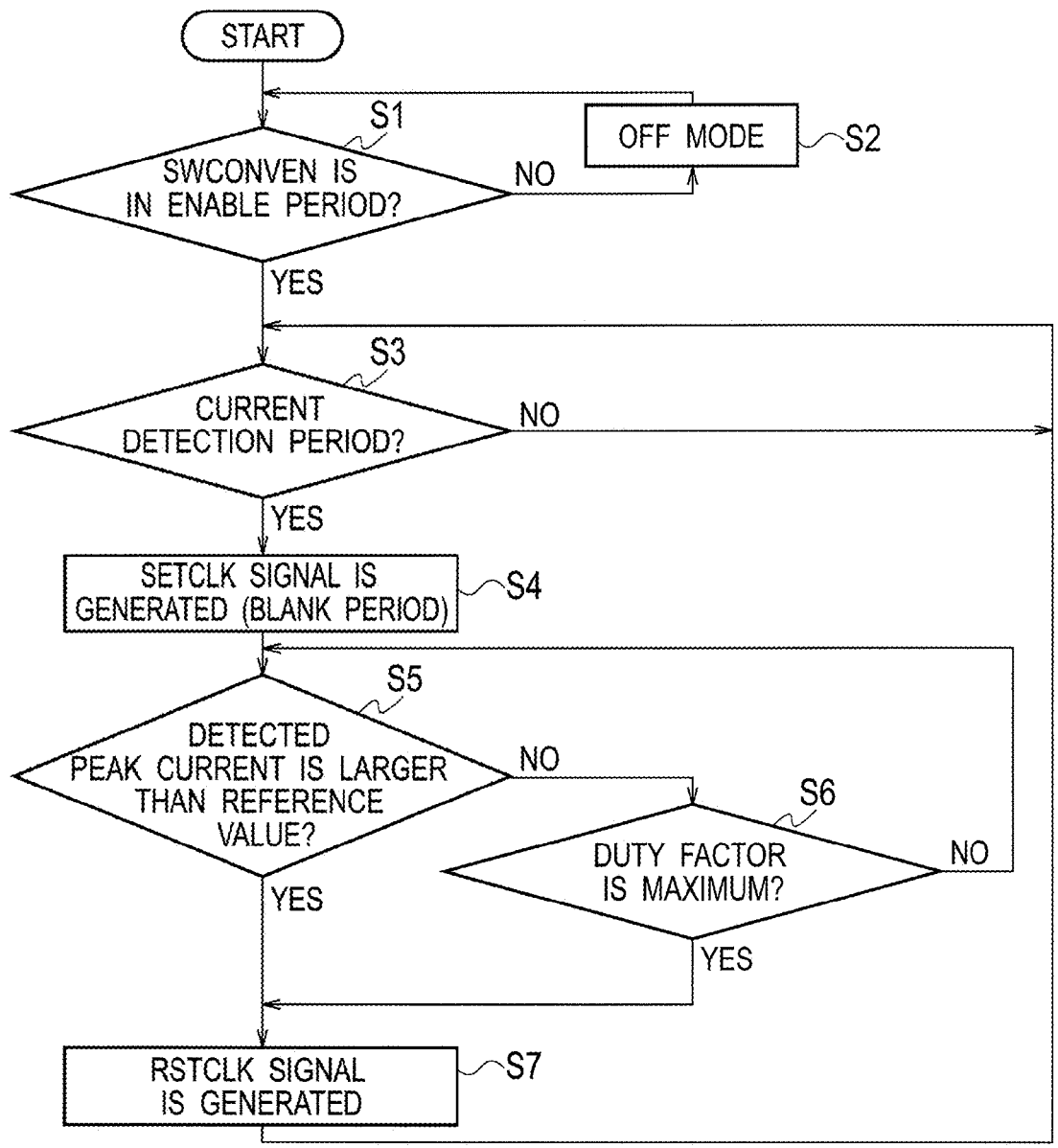
[FIG. 3] A flow chart showing normal operation of the switching current control circuit.
Figure 4:
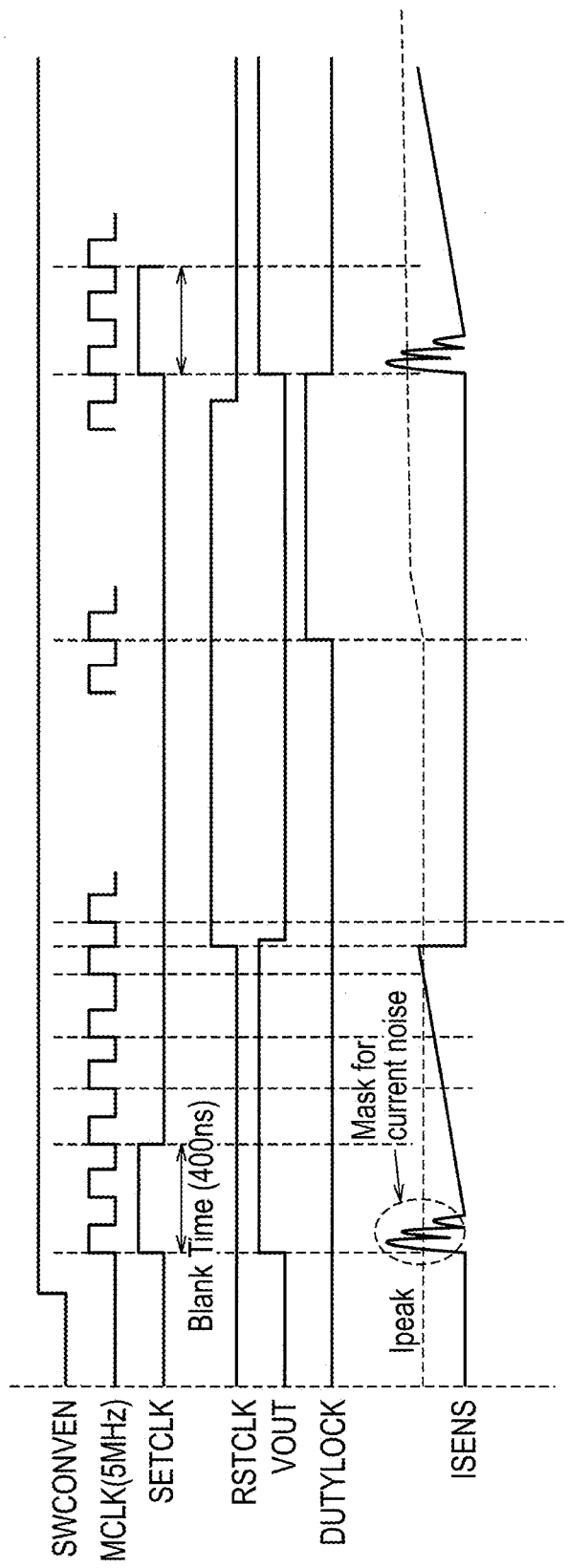
[FIG. 4] A diagram showing a time chart corresponding to the flow chart shown in FIG. 3

FIG. 3 is a flow chart showing a normal operation when not taking into consideration an increase/decrease operation of the switching frequency in the switching pulse. Moreover, FIG. 4 shows a timing chart corresponding to a flow chart shown in FIG. 3. In FIG. 4, a master clock MCLK is set to 5 MHz as an example. Since the operation of the switching pulse supply circuit 90 is enable if the SWCONVEN from the timing control circuit 6 is an enable period, it is firstly determined whether the SWCONVEN is the enable period (Step S1). If the SWCONVEN is not the enable period, an Off mode is set up (Step S2), and then the process returns to Step S1 again.

If the SWCONVEN is the enable period, the process goes to the next Step S3, and it is determined whether it is in a current detection period (ON period). If it is not in the current detection period, the process returns to Step S3 again. If it is in the current detection period, the process goes to Step S4, and a SETCLK signal which is a blank period signal is generated. ISENS shown in FIG. 4 is the ISENS signal shown in FIG. 1, and is equivalent to Vsens detected as voltage by the comparator circuit 91. If the voltage Vsens is detected and then a value of the current sensing resistor 56 is obtained, a value of the current Isen which flows through the current sensing resistor 56 can also be obtained. Herein, since it is easy to explain the operation using a current signal, the ISENS signal is explained so that the ISENS signal is the same current signal as the current Isen.

As shown in FIG. 4, since the ISENS signal produces a switching noise when the FET 55 is turned from OFF to ON, a mask of the ISENS signal is carried out so that a current during this period is not detected. This period is equivalent to Blank Time of SETCLK, and may be 400 ns, for example.

Then, the ISENS signal is compared with the peak current value Ipeak being setup beforehand (Step S5). If the ISENS signal is larger than Ipeak, the process returns to Step S3 after the clock signal RSTCLK is generated (Step S7). In this case, since the RSTCLK is generated, and the ISENS is large rather than Ipeak, the output IPEAKDET of the comparator 1 is high level. An output of the logic circuit 7 becomes a high level signal, and is supplied into the R terminal of the RS flip-flop 8. An output of the RS flip-flop 8 becomes a high level signal by adjusting DC voltage level by the level shift unit 9 after becoming a low level signal. The high level signal is converted into a low level signal by an inverter circuit composed of the FETs 10 and 11. That is, since VOUT becomes a low level signal, the FET 55 is turned OFF.

On the other hand, if the ISENS is equal to the Ipeak or is smaller than the Ipeak, the process goes to Step S6, and then it is determined whether a duty factor of ON/OFF period of the switching pulse is the maximum. If the duty factor is not the maximum, the process returns to Step S5. If the duty factor is the maximum, the RSTCLK is generated (Step S7), and then the process returns to Step S3. Also in this case, since the VOUT becomes a low level signal in the same manner as the case where the current ISENS is larger than the peak current value Ipeak, the FET 55 is turned OFF.

Next, there will be explained an operation in the case of changing the switching frequency from the above-mentioned normal operation. First, a device in which 10-bit A/D conversion is possible, for example, is used for the A/D converter 2 shown in FIG. 1. Moreover, the A/D converter 2 is composed of two sample hold circuits and one AD converter. Values of y0 and y1 subjected to the A/D conversion are output from the A/D converter 2, and are supplied into the peak current calculation circuit 3.

The D/A conversion circuit 5 is a decoder type D/A conversion circuit, and is composed of a DAC decoder 5a and an R-2R rudder type D-A converter 5b. A DA offset value of the D/A conversion circuit 5 measured beforehand and an AD offset value of the A/D converter 2 are memorized in the AD/DA offset setting unit 4. At the time of driving of the A/D converter 2 and the D/A conversion circuit 5, the AD offset value is subtracted from the A/D conversion data, and the DA offset value is subtracted from the D/A conversion value, in the peak current calculation circuit 3.

Figure 5:
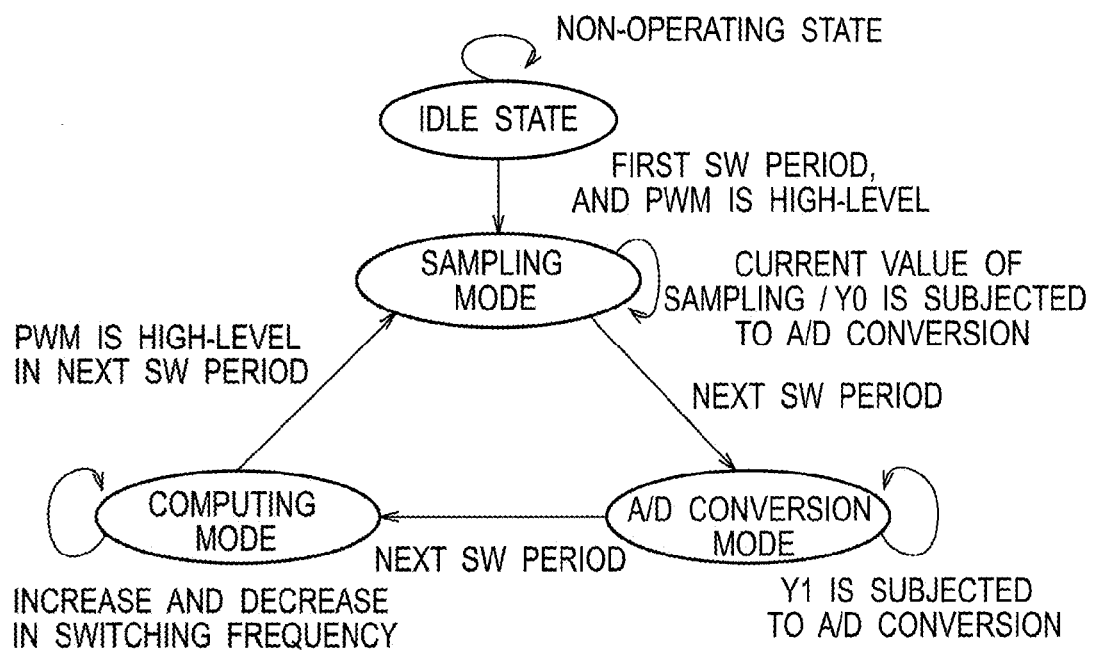
[FIG. 5] A diagram showing operational modes assigned for every one cycle of a switching pulse.
Figure 6:
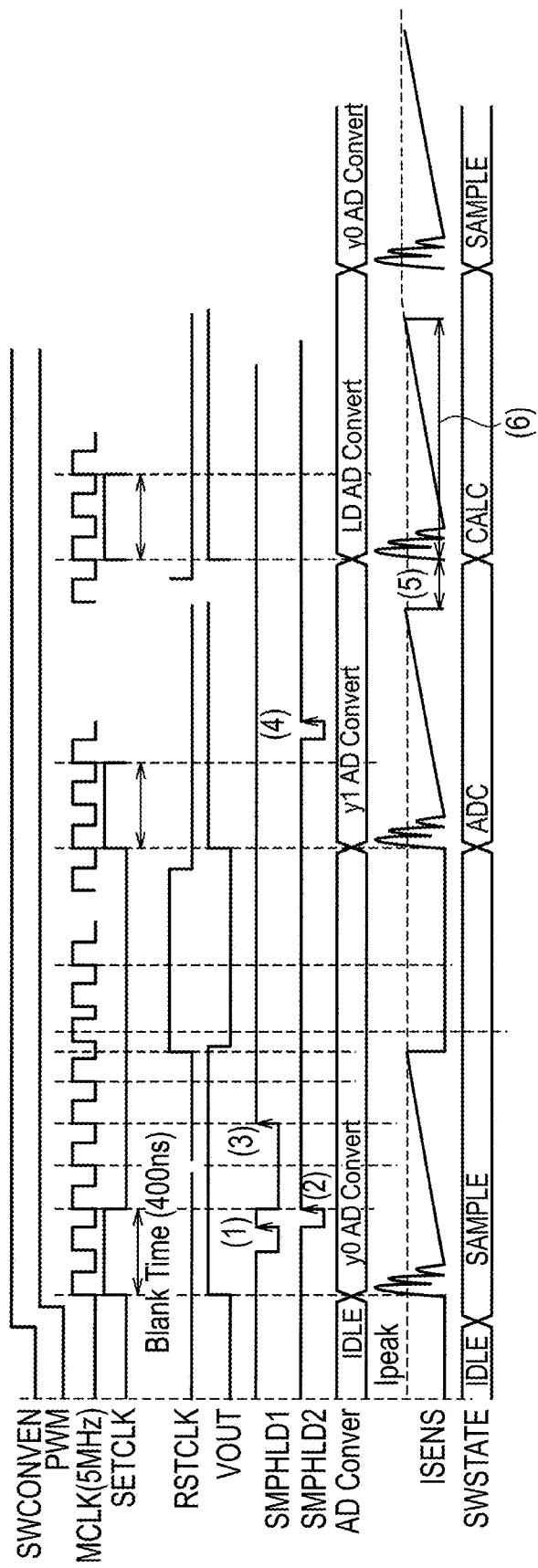
[FIG. 6] A diagram showing a time chart corresponding to the operational modes shown in FIG. 5.
Figure 7:
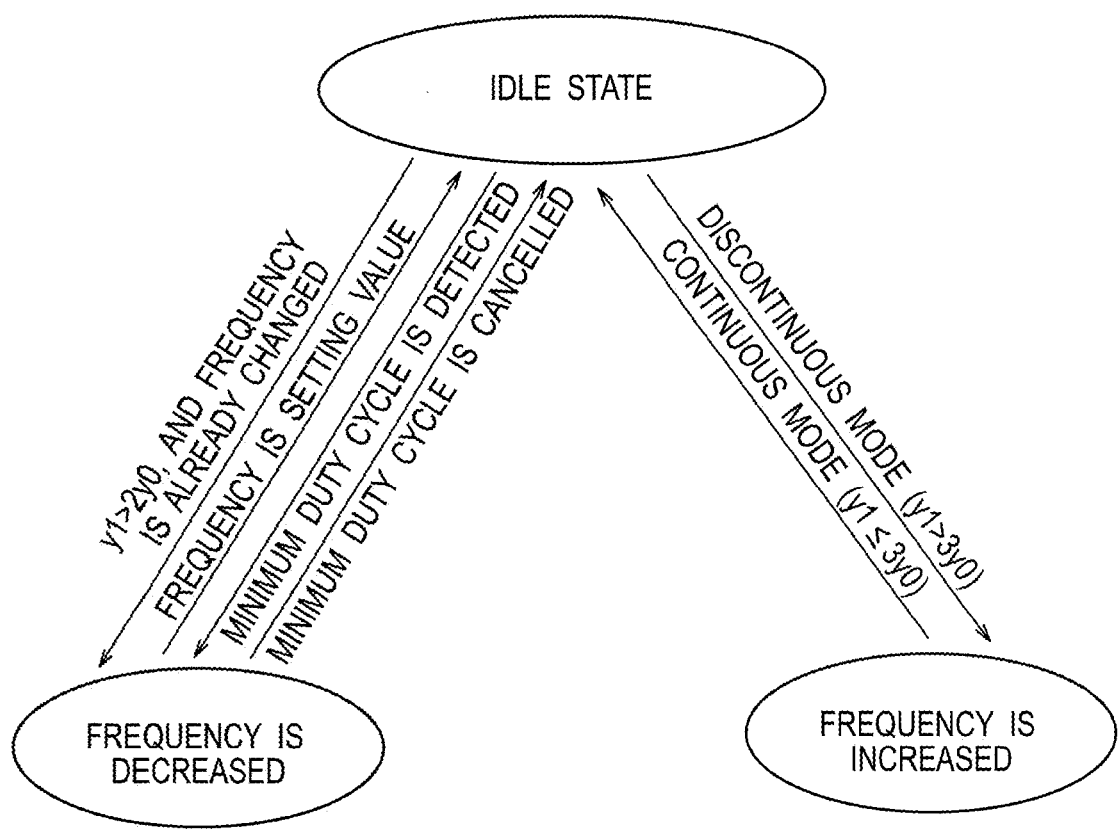
[FIG. 7] A diagram showing operational modes of increase and decrease in a switching frequency

FIG. 5 shows the switching current control circuit according to the present invention, and is a diagram showing a transition of operational modes assigned for every one cycle of the switching pulse in the case of performing an increase and decrease in the switching frequency. FIG. 6 shows a time chart corresponding to the transition of the operational modes shown in 5. FIG. 7 is a diagram showing a transition of the operational modes in the case of changing the switching frequency. For control of the operational modes shown in FIGS. 5 and 7, a control signal is transmitted from a control unit (not shown). It is an idle state at first and is in a non-operating state. In the same manner as the case of FIG. 4, it is firstly determined whether the SWCONVEN is the enable period, and then is determined whether the PWM is the high level. When the PWM is the high level, change of the cycle in ON/OFF period of the switching operation is enabled.

As shown in FIG. 5, it is shifted to a sampling mode in one cycle of an initial first switching pulse cycle on the above conditions. Although it is preferred in the sampling mode to sample and hold a current value y0 in t0 and a current values y1 in t1 of the ISENS, as shown in FIG. 2, since the A/D converter 2 includes only one AD converter, the A/D converter 2 cannot perform the A/D conversion, holding two values at once.

Accordingly, in the sampling mode as shown in FIG. 6, the y0 is sampled and held by the A/D converter 2 in timing (1) of first rising of the SMPHLD1 signal, and the current value y0 is subjected to the A/D conversion and is output in timing (2) of first rising of the SMPHLD2 signal. This A/D conversion output of y0 is supplied into the arithmetic control circuit 3 as an ADOUT signal. Furthermore, at the first switching pulse, the current value y1 is sampled and held by the A/D converter 2 in timing (3) of second rising of the SMPHLD1 signal.

After the sampling mode is completed, it shifts to a second switching pulse cycle that is ON/OFF cycle in the next switching operation. The second switching pulse cycle is in an A/D conversion mode. In the A/D conversion mode, the current value y1 sampled and held in the sampling mode is subjected to the A/D conversion by the A/D converter 2 and then is output, in timing (4) of second rising of the SMPHLD2 signal. The aforementioned A/D conversion output of y0 is supplied into the arithmetic control circuit 3 as an ADOUT signal.

After the A/D conversion mode is completed, it shifts to a third switching pulse cycle that is ON/OFF cycle in the next switching operation. The third switching pulse cycle is in a compute mode. In the compute mode, the A/D converter 2 performs only the A/D conversion of the current ISENS, but data of y0, y1 is not sampled and held. The A/D conversion data of the current ISENS is output to the arithmetic control circuit 3 as an ADOUT signal.

The compute mode uses y0 and y1 input into the arithmetic control circuit 3; the upper limit Y1 of the initial value, ON period Ton, the initial switching frequency f memorized in the initial value setting unit 12; and the AD offset value and the DA offset value memorized in the AD/DA offset setting unit 4 etc. If the lower limit Y0 is changed, the lower limit Y0 can be detected from the ISENSE signal detected in the current sensing resistor 56.

The arithmetic control circuit 3 determines whether it is in the discontinuous mode or the continuous mode using the above-mentioned value, as shown in FIG. 7. As mentioned above, the arithmetic control circuit 3 determines that it is in the continuous mode (CCM) at the time of $y1<=3y0$, and determines that it is in the discontinuous mode at the time of $y1>3y0$. If the arithmetic control circuit 3 determines that it is in the discontinuous mode, the switching pulse frequency is increased so as to satisfy $y1<=3y0$ in order to return to the continuous mode.

In the case of increasing the switching pulse frequency, a value of the switching frequency to be changed is transmitted from the arithmetic control circuit 3 to the frequency setting circuit 13 so that the frequency setting circuit 13 holds the switching frequency value. Then, the comparator 14 compares the frequency value held in the frequency setting circuit 13 with data from the frequency counter 15, and then the comparator 14 generates SETCLK if the frequency value becomes a target frequency value. The frequency counter 15 is operated on a 10-MHz clock, for example. Since a cycle and a duty factor of the SWON are changed according to the SETCLK signal, the VOUT is also changed similarly.

On the other hand, it is considered to what extent the switching frequency should be further increased, after the switching frequency is changed to be shifted to the continuous mode as mentioned above. In this case, it is determined whether the lower limit Y0 becomes a sufficiently large positive value as a result of increasing of the switching frequency. As mentioned above, $Y0=(3y0-y1)/2$ is realized. As a guide, if Y0 is larger than y0/2, it may be determined that it becomes sufficiently larger than 0. Accordingly, since it becomes a conditions of $Y0>(y0/2)$, $(3y0-y1)/2>(y0/2)$ is realized, and $2y0>y1$ can be derived if the equation is organized.

Accordingly, since the lower limit Y0 is also increased if the switching frequency is increased, it can be determined that Y0 is a sufficiently large value if $2y0>y1$ is realized at the time of the lower limit Y0 is increased, and therefore it is preferable to return a value of the switching frequency to the initial setting frequency value. Accordingly, when the switching frequency is changed, and $y1>2y0$ is realized, the switching frequency is decreased by decreasing the lower limit Y0 in order to return the switching frequency to the initial setting frequency value.

On the other hand, if the minimum duty cycle is detected, the switching frequency is decreased in order to cancel the minimum duty cycle. Since the minimum duty cycle is a cycle in which ON time is the same 400 ns as the Blank time for masking the switching noise, there is a problem of operation in the ON time being not more than 400 ns. In this case, the switching frequency is decreased by decreasing the lower limit Y, and thereby the minimum duty cycle state is canceled by prolonging the ON time.

In the case of decreasing the switching frequency, a value of the switching frequency to be changed is transmitted from the arithmetic control circuit 3 to the frequency setting circuit 13 so that the frequency setting circuit 13 holds the switching frequency value. Then, the comparator 14 compares the frequency value held in the frequency setting circuit 13 with data from the frequency counter 15, and then the comparator 14 generates SETCLK if the frequency value becomes a target frequency value.

As mentioned above, the increase and decrease of the switching frequency changes periods of the OFF period (5) in the switching pulse, and the ON period (6) in the switching pulse. In this manner, the operation shown in FIGS. 5 and 7 is repeated.

In the present embodiment, although the peak current value (upper limit) is usually fixed, the peak current value can also be changed. If the peak current value is changed, the changed peak current value is output from the arithmetic control circuit 3 as a digital signal called IPEAKSET, and then is supplied to the D/A conversion circuit 5. The IPEAKSET is subjected to the D/A conversion in the D/A conversion circuit 5, and then is output as an analog signal called IDAC to be used as new threshold voltage of the comparator 1.

Since an output IPEAKDET of the comparator 1 becomes a high level signal when the current ISENS (voltage Vsens) exceeds the threshold voltage IDAC of the comparator 1, an output SWON signal which passes through the subsequent logic circuit 7 and the RS flip-flop 8 etc. becomes a low level signal, and then becomes a high level signal by changing its DC voltage level by the level shift unit 9. The aforementioned high level signal becomes a low level signal by the inverter composed of next FETs 10 and 11, and then the FET 55 turns OFF.

As mentioned above, the switching current control circuit 100 according to the first embodiment calculates the lower limit of the detected current for providing timing of switching the switching pulse from OFF to ON based on the data of the detected current output from the A/D conversion circuit 5 which detects the load current in the ON period of the switching pulse as a detected current and converts the detected current into digital data; and determines that it is in the continuous mode when the lower limit of the detected current is equal to or greater than 0, and determines that it is in the discontinuous mode when the lower limit of the detected current is the negative value. Accordingly, the continuous mode/the discontinuous mode can be efficiently determined quickly, since the mode can be determined based on the detected current even if an actual load current is not measured.

Moreover, since the switching current control circuit 100 itself is connected to the LED 52 via the switching element 55 and the inductor 53, the average current which flows into the LED 52 can be controlled to be constant, even if the switching pulse frequency is increased. Accordingly, electric power consumption can be reduced.

[Second Embodiment]
(Comparative Example)

Prior to an explanation of a switching current control circuit 100 according to a second embodiment, there will be explained a switching current control circuit according to a comparative example with reference to above-mentioned FIGS. 8 and 9.

FIG. 8 shows a circuit configuration in which a conventional switching current control circuit is connected to a driving circuit of a light emitting diode 52.

An anode side of the light emitting diode 52 is connected to DC power supply 51, and a cathode side of the light emitting diode 52 is connected to an inductor 53. A diode 54 is disposed in parallel with the light emitting diode 52 and the inductor 53 both connected in series. A field effect transistor (FET) 55 as a switching element is connected to an anode side of the inductor 53 and the diode 54, and a current sensing resistor 56 is connected to the FET 55 in series.

There is disposed a switching current control circuit 70 used for switching control of the FET 55. The switching current control circuit 70 is composed of a comparator 57 and an RS flip-flop 58. One end of the current sensing resistor 56 is connected to a positive terminal of the 57, and other end of the current sensing resistor 56 is connected to GND. An output of the comparator 57 is connected to an R terminal of the RS flip-flop 58, and an output of the RS flip-flop 58 is connected to a gate of the FET 55.

In this case, a current which flows through the light emitting diode 52 is controlled using the switching current control circuit 70. An SW signal in a time chart shown in FIG. 9 is an output of the RS flip-flop 58, and is also an input signal to the gate of the FET 55. Iout shown in FIG. 9 corresponds to a current which flows through the light emitting diode 52 and the inductor 53. A current Isen flowing through the current sensing resistor 56 during an ON period is the same current as Iout.

Since a value of Isen is low immediately after the FET 55 is turned ON, a voltage applied on the positive terminal of the comparator 57 is low, and a voltage applied on the current sensing resistor 56 is lower than Vpk. Herein, Vpk denotes a peak voltage corresponding to a peak current (upper limit) Ipk of the current Iout which flows through the light emitting diode 52.

In this case, the output of the comparator 57 is low level and a low level signal is input into the R terminal of the RS flip-flop 58. Accordingly, if a high-level pulse signal is supplied into an S terminal, the output of RS flip-flop 58 becomes a high level signal, and thereby the ON period is continued.

However, an amount of the current Iout which flows through the light emitting diode 52 increases, with the passage of time. In this case, since an amount of the current Isen also increases, the output of the comparator 57 is shifted to high level if the voltage applied on the current sensing resistor 56 becomes higher than Vpk, and then a high level signal is supplied to the R terminal of the RS flip-flop 58. Accordingly, the output of the RS flip-flop 58 becomes a low level signal if the S terminal is in a state of low level, and therefore this period corresponds to the OFF period shown in FIG. 9.

During the OFF period, the FET 55 is turned OFF, and thereby a current will not flow through the FET 55 and the current sensing resistor 56. However, a closed circuit is formed of the light emitting diode 52, the inductor 53, and the diode 54. Since the current which flowed through the inductor 53 up to that time is intercepted when the FET 55 is turned OFF, a back electromotive force occurs in the inductor 53. Due to the back electromotive force of the inductor 53, the diode 54 is conducting, and then the current flows through the closed circuit of the light emitting diode 52, the inductor 53, and the diode 54. Since the back electromotive force of the inductor 53 gradually decreases, the current Iout also linearly decreases.

If the peak current Ipk is set as shown in FIG. 9, the current Iout linearly increases during the ON period as shown in FIG. 9. Then, if the current Iout reaches Ipk, it will be switched to the OFF period. During the OFF period, since the FET 55 is tuned OFF, the current Iout linearly decreases. If the current Iout decreases up to a constant current value, it is switched to the ON period again, the current is supplied from the DC power supply 51 thereto, and thereby the current Iout linearly increases. Thus, the load current of the light emitting diode 52 is controlled, repeatedly turning ON and OFF.

As shown in FIG. 9, Iout takes the shape of triangular waveform, but the current which flows through the light emitting diode 52 is calculated with an integral value of Iout. Thereby, an average value of the current which flows through the light emitting diode 52 can be calculated.

However, in the switching current control circuit according to the comparative example, the output current Iout is changed depending on voltage drop Vin of the DC power supply 51, voltage drop Vout of the light emitting diode 52, and value changes of the inductance L of the inductor 53. For example, considering the case where the voltage value of Vin becomes larger, an inclination AION and AIOFF of a linear part in the triangular waveform of Iout is increased, due to change of Iout.

The peak current Ipk is fixed, and it is switched to the OFF period when the Iout exceeds the Ipk. Therefore, since the current waveform of the output current Iout is largely changed as a dashed line of FIG. 9, the periods of ON and OFF grows shorter, and the duty cycle is also changed. Accordingly, observing a wave of the Iout before and after change of Vin, since both areas of the triangular waveform are clearly differ from each other, it is difficult to make an average value of the load current a constant value.

(Switching Current Control Circuit According to Second Embodiment)

Figure 10:
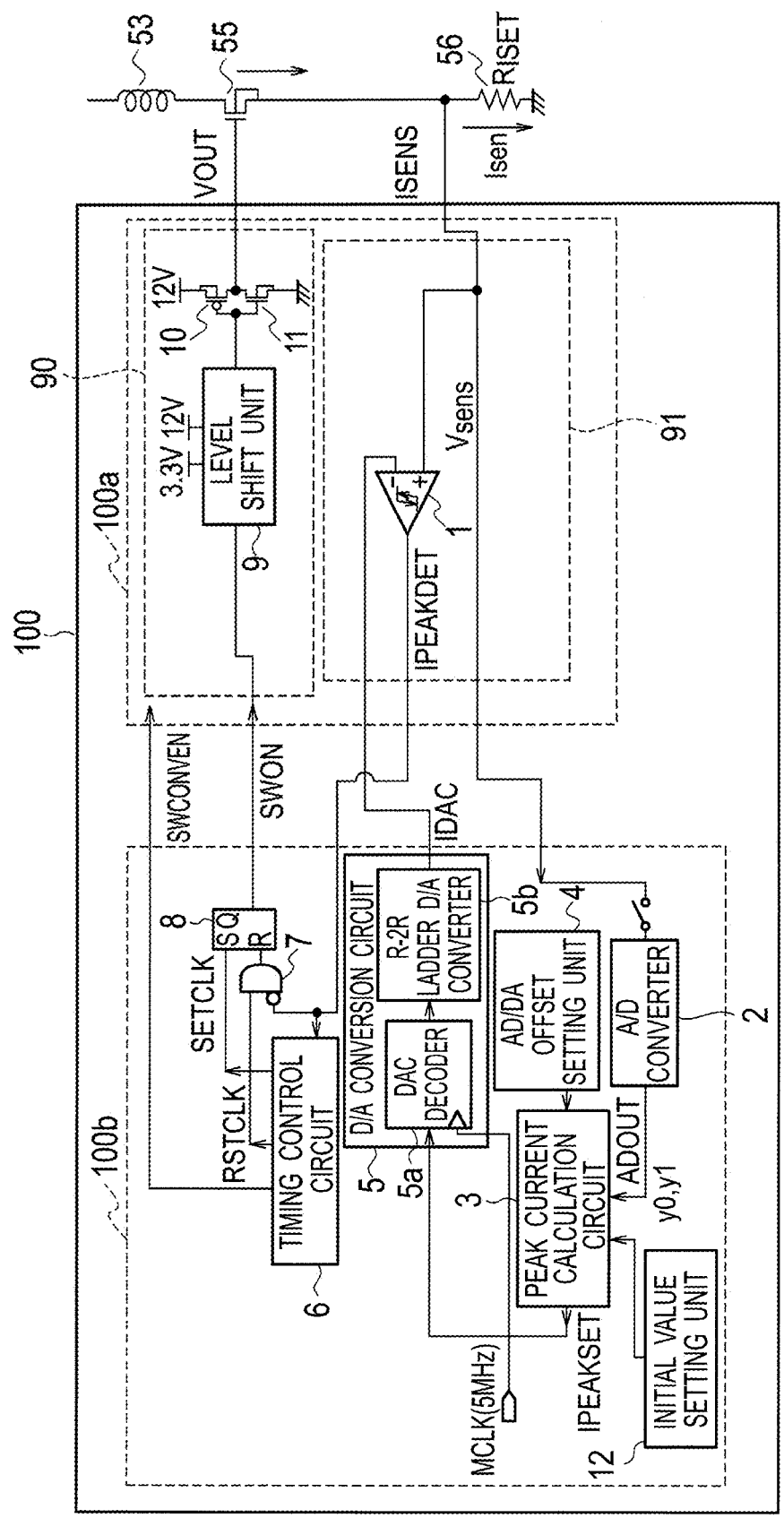
[FIG. 10] A diagram showing a circuit configuration of a switching current control circuit according to the present invention.

As shown in FIG. 10, a switching current control circuit 100 according to the second embodiment is a switching current control circuit which controls by switching operation a load current which flows through a predetermined device.

More specifically, the switching current control circuit 100 includes: a switching pulse supply circuit 90 which supplies a switching pulse for switching operation; a comparator circuit 91 which compares a load current detected as a detected current in the ON period of the switching pulse with a peak current value; and a peak current calculation circuit 3 which calculates a linear increasing rate of the detected current in the ON period of the switching pulse, calculates a maximum current value at the time of assuming that the detected current is increased until end of the ON period of switching operation using the increasing rate, and uses the maximum current value as the peak current value, wherein the switching pulse is switched to the OFF period based on the output signal of the comparator circuit 91 when the detected current exceeds the peak current value calculated by the peak current calculation circuit 3.

FIG. 10 shows a structure example of the switching current control circuit 100 according to the present invention. An element(s) to which the same reference numeral is attached as FIG. 8 denotes the same circuit element. Therefore, a light emitting diode 52 shown in FIG. 8 is considered as an example of load, and a driving circuit portion of the light emitting diode 52 is similarly structured. More specifically, a DC power supply 51, an inductor 53, a diode 54, an FET 55, a current sensing resistor 56, etc. are connected to each other in the same manner as FIG. 8.

The switching current control circuit 100 is composed of an analog circuit unit 100*a* and a digital circuit unit 100*b*. The analog circuit unit 100*a* is composed of a switching pulse supply circuit 90 and a comparator circuit 91. The comparator circuit 91 is composed of a comparator 1. The switching pulse supply circuit 90 is composed of a level shift unit 9, an FET 10 which is P-channel MOS, an FET 11 which is N-channel MOS, etc. A gate of the FET 10 and a gate of the FET 11 are connected to each other, a drain of the FET 11 is connected with a source of the FET 10, and an inverter is composed of the FET 10 and the FET 11.

The digital circuit unit 100*b* is composed of an A/D converter 2, a peak current calculation circuit 3, an AD/DA of f set setting unit 4, a D/A conversion circuit 5, a timing control circuit 6, a logic circuit 7, an RS flip-flop 8, and an initial value setting unit 12.

Figure 11:
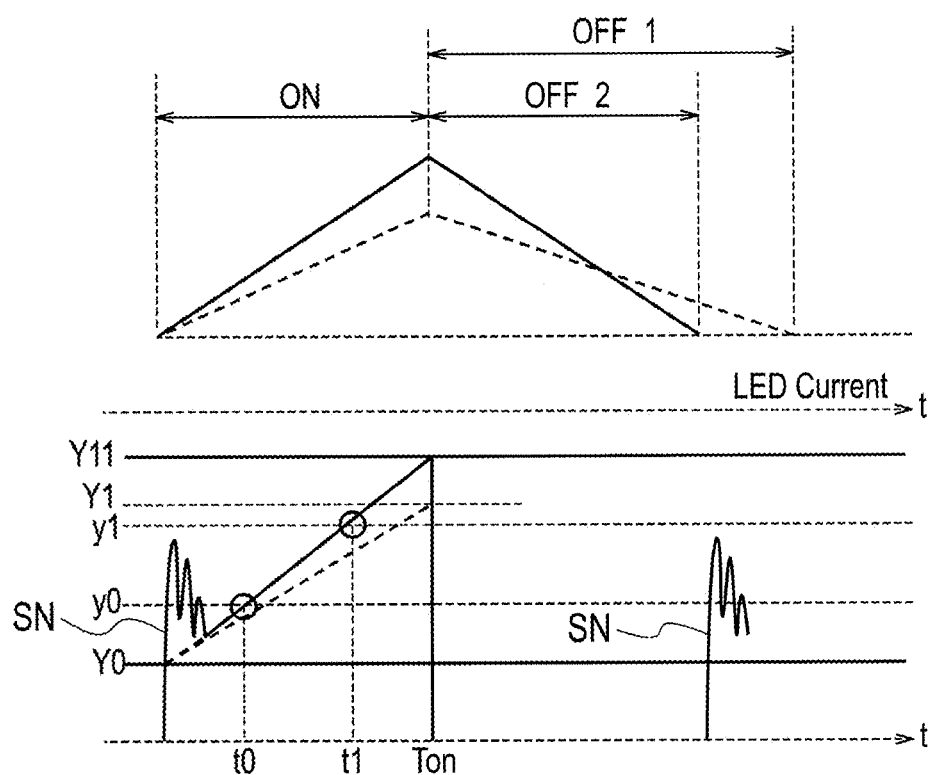
[FIG. 11] A diagram showing a method for determining a peak current value of the switching current control circuit according to the present invention.

FIG. 11 shows how a current which flows through the light emitting diode 52 is controlled by the switching current control circuit 100 shown in FIG. 10. An upper part of FIG. 11 shows change of the current which flows through the light emitting diode 52. On the other hand, a lower part of FIG. 2 shows change of the current Isen which flows through the current sensing resistor 56. During ON period of switching operation (switching pulse), the current Isen becomes the same current as a current which flows through the light emitting diode. However, since the FET 55 is turned OFF during the OFF period of the switching pulse, the current Isen is 0.

When the SN is switched from OFF to ON by the switching operation of the FET 55, a switching noise is produced as shown in FIG. 11. Data of the SN is sampled in the ON period at the two time points t0 and t1 so that the switching noise period is avoided. The SN data at the time of t0 is set to y0, and the SN data at the time of t1 is set to y1.

In FIG. 11, Y1, Y0 are values set up by the initial value setting unit 12, Y1 is a peak current value (upper-limit current value) of the load current or detected current, and Y0 is a lower-limit current value of the load current or detected current. An initially setting peak current value is set to Y1, and a lower limit is set to Y0, and an ON period in the ON/OFF periods is set to Ton based on the Y1 and Y0. Moreover, a dashed line indicates initial current Isen and a current which flows through the light emitting diode 52, and an OFF period at that time is set as OFF 2.

In this case, if the voltage Vin of the DC power supply 51 and the voltage Vout of the light emitting diode 52 are dropped, and inductance L of the inductor 53 is changed, for example, it is supposed that a current which flows through the light emitting diode 52 is changed, and a current Isen is also changed. The solid line SN indicates the changed current Isen. Moreover, data at the time points of t0=Ton×(1/4) and t1=Ton×(3/4) is y0 and y1. An inclination SL of a straight line part of SN (Isen) can be calculated based on the above-mentioned data. The inclination SL corresponds to an increasing rate of the current Isen, and also corresponds to an increasing rate of the current which flows through the light emitting diode 52.

The inclination SL=(y1−y0)/(t1−t0) is realized. The peak current value of SN is changed according to the inclination SL.

An average value AVE of the current Isen after change becomes AVE=(y0+y1)/2. New peak current value Y11 is set up to be Y11=AVE+SL×(Ton/2). In other words, it is set up to be Y11=AVE+((y1−y0)/2)×(Ton/2). Moreover, the lower limit Y0 is fixed without being changed.

The above-mentioned setup is equivalent to calculating a linear increasing rate of the detected current Isen in the ON period of the switching pulse, and calculating a maximum current value at the time of assuming that the detected current Isen is increased until the end of the ON period of the switching pulse using the increasing rate. Although the switching operation cycle is changed by setting up in this way, the Ton which is the ON period of switching operation is not changed. The solid line of the upper part of FIG. 11 indicates the change of the current which flows through the light emitting diode 52 when the peak current value is changed into Y11.

If the inclination SL of the straight line of SN data is changed again from this state, new upper limit Y12 is calculated by the same algorithm as mentioned above. For example, the average value of the upper limit Y11 and the lower limit Y0 is set to AVE1. Moreover, data sampled at two points during the ON period is set to y2 and y3. The sampling in the two points is performed at one fourth of Ton and three fourths of Ton.

AVE1=(y2+y3)/2
Y12=AVE1+((y3−y2)/2)×(Ton/2) are realized.

Here, refer to the flowchart shown in FIG. 3 and the timing chart shown in FIG. 4 used in the explanation for the switching current control circuit 100 according to the first embodiment.

FIG. 3 is a flow chart showing a normal operation when not taking into consideration the change of inclination SL of the straight line of the current Isen.

In FIG. 4, the master clock MCLK is set to 5 MHz as an example. Since the operation of the switching pulse supply circuit 90 is enable if the SWCONVEN from the timing control circuit 6 is an enable period, it is firstly determined whether the SWCONVEN is the enable period (Step S1). If the SWCONVEN is not the enable period, the Off mode is set up (Step S2), and then the process returns to Step S1 again.

If the SWCONVEN is the enable period, the process goes to the next Step S3, and then it is determined whether it is in a current detection period (ON period). If it is not in the current detection period, the process returns to Step S3 again. If it is in the current detection period, the process goes to Step S4, and then the SETCLK signal which is a blank period signal is generated. The Isens shown in FIG. 4 is the ISENS signal shown in FIG. 10, and is equivalent to the Vsens detected as voltage by the comparator circuit 91. If the voltage Vsens is detected and then a value of the current sensing resistor 56 is obtained, a value of the current Isen which flows through the current sensing resistor 56 can also be obtained. Herein, since it is easy to explain the operation using a current signal, the ISENS signal is explained so that the ISENS signal is the same current signal as the current Isen.

As shown in FIG. 4, since the ISENS signal produces a switching noise when the FET 55 is turned from OFF to ON, a mask of the ISENS signal is carried out so that a current during this period is not detected. This period is equivalent to Blank Time of SETCLK, and may be 400 ns, for example.

Then, the ISENS signal is compared with the peak current value Ipeak being setup beforehand (Step S5). If the ISENS signal is larger than Ipeak, the process returns to Step S3 after the clock signal RSTCLK is generated (Step S7). In this case, since the RSTCLK is generated, and the ISENS is large rather than Ipeak, the output IPEAKDET of the comparator 1 is high level. An output of the logic circuit 7 becomes a high level signal, and is supplied into the R terminal of the RS flip-flop 8. An output of the RS flip-flop 8 becomes a high level signal by adjusting DC voltage level by the level shift unit 9 after becoming a low level signal. The high level signal is converted into a low level signal by an inverter circuit composed of the FETs 10 and 11. That is, since VOUT becomes a low level signal, the FET 55 is turned OFF.

On the other hand, if the ISENS is equal to the Ipeak or is smaller than the Ipeak, the process goes to Step S6, and then it is determined whether a duty factor of the ON/OFF period of the switching pulse is the maximum. If the duty factor is not the maximum, the process returns to Step S5. If the duty factor is the maximum, the RSTCLK is generated (Step S7), and then the process returns to Step S3. Also in this case, since the VOUT becomes a low level signal in the same manner as the case where the current ISENS is larger than the peak current value Ipeak, the FET 55 is turned OFF.

Next, there will be explained an operation in the case where the inclination SL of the straight line of the ISENS signal is changed from the above-mentioned normal operation, and the peak current value (upper limit) is changed. First, a device in which 10-bit A/D conversion is possible, for example, is used for the A/D converter 2 shown in FIG. 10. Moreover, the A/D converter 2 is composed of two sample hold circuits and one AD converter. Values of y0 and y1 subjected to the A/D conversion are output from the A/D converter 2, and are supplied into the peak current calculation circuit 3.

The D/A conversion circuit 5 is a decoder type D/A conversion circuit, and is composed of a DAC decoder 5a and an R-2R rudder type D-A converter 5b. The DA offset value of the D/A conversion circuit 5 measured beforehand and the AD offset value of the A/D converter 2 are memorized in the AD/DA offset setting unit 4. At the time of driving of the A/D converter 2 and the D/A conversion circuit 5, the AD offset value is subtracted from the A/D conversion data, and the DA offset value is subtracted from the D/A conversion value, in the peak current calculation circuit 3.

Figure 12:
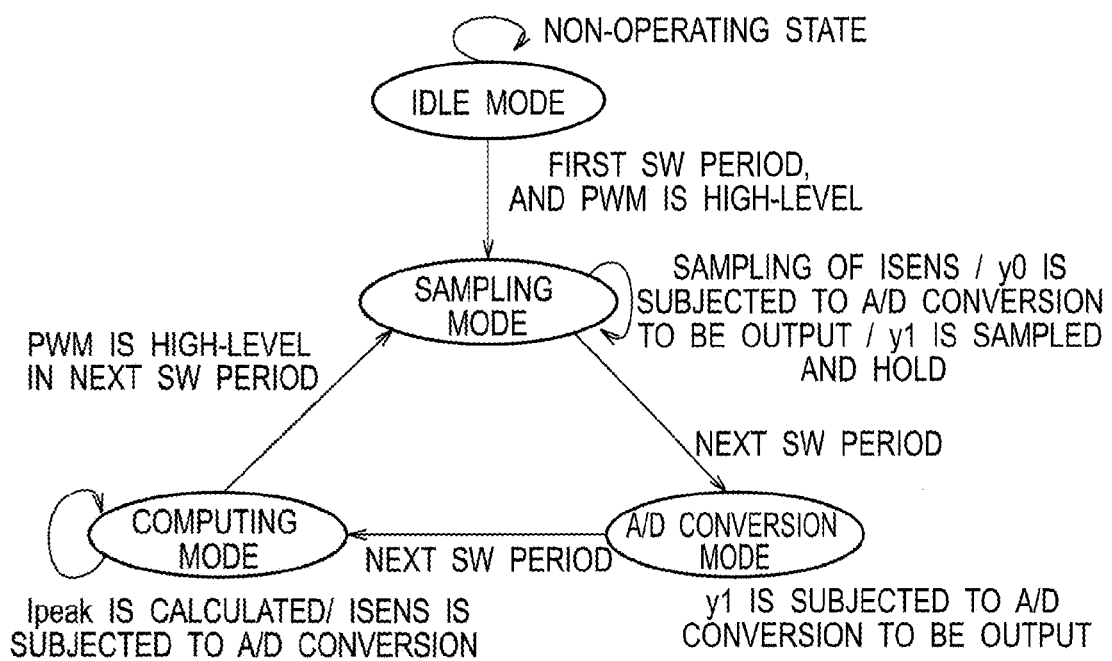
[FIG. 12] A diagram showing operational modes assigned for every one cycle of a switching pulse.
Figure 13:
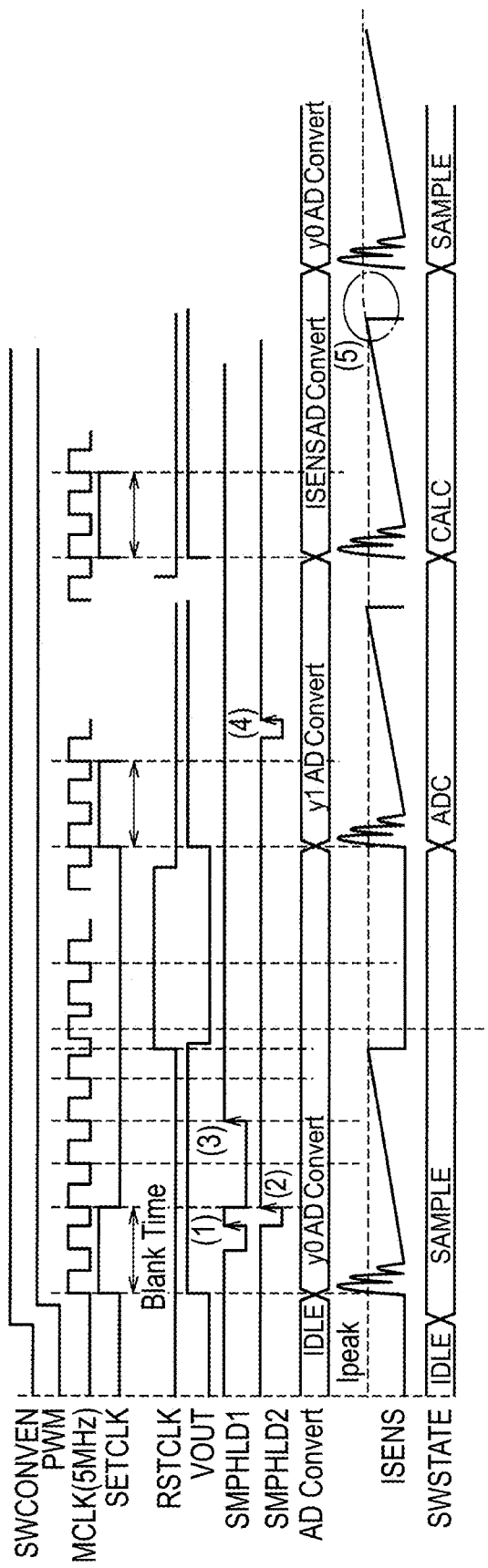
[FIG. 13] A diagram showing a time chart corresponding to the operational modes shown in FIG. 5.

FIG. 12 shows the switching current control circuit according to the present invention, and is a diagram showing a transition of operational modes assigned for everyone cycle of the switching pulse in the case of changing of the peak current value. FIG. 13 shows a time chart corresponding to the transition of the operational modes shown in 12. Regarding control of the operational modes shown in FIG. 12, a control signal is transmitted from a control unit (not shown). It is an idle state at first and is in a non-operating state. In the same manner as the case of FIG. 4, it is firstly determined whether the SWCONVEN is the enable period, and then is determined whether the PWM is the high level. When the PWM is the high level, change of the cycle in ON/OFF period of the switching operation is enabled.

It is shifted to a sampling mode in one cycle of an initial first switching pulse cycle on the above conditions. Although it is preferred in the sampling mode to sample and hold a current value y0 in t0 and a current values y1 in t1 of the ISENS, as shown in FIG. 2, since the A/D converter 2 includes only one AD converter, the A/D converter 2 cannot perform the A/D conversion, holding two values at once.

Accordingly, in the sampling mode as shown in FIG. 13, y0 is sampled and held by the A/D converter 2 in timing (1) of first rising of the SMPHLD1 signal, and the current value y0 is subjected to the A/D conversion and is output in timing (2) of first rising of the SMPHLD2 signal. The A/D conversion output of y0 is supplied into the peak current calculation circuit 3 as an ADOUT signal. Furthermore, at the first switching pulse, the current value y1 is sampled and held by the A/D converter 2 in timing (3) of second rising of the SMPHLD1 signal.

After the sampling mode is completed, it shifts to a second switching pulse cycle that is ON/OFF cycle in the next switching operation. The second switching pulse cycle is in an A/D conversion mode. In the A/D conversion mode, the current value y1 sampled and held in the sampling mode is subjected to the A/D conversion by the A/D converter 2 and then is output, in timing (4) of second rising of the SMPHLD2 signal. The aforementioned A/D conversion output of y0 is supplied into the peak current calculation circuit 3 as an ADOUT signal.

After the A/D conversion mode is completed, it shifts to a third switching pulse cycle that is ON/OFF cycle in the next switching operation. The third switching pulse cycle is in a compute mode. In the compute mode, the A/D converter 2 performs only the A/D conversion of the current ISENS, but data of y0, y1 is not sampled and held. The A/D conversion data of the current ISENS is output to the peak current calculation circuit 3 as an ADOUT signal.

In the compute mode, the peak current calculation circuit 3 calculates a new peak current value Y11 by using y0 and y1 input into the peak current calculation circuit 3; the upper limit Y1 and the lower limit Y0 of the initial value, ON period Ton, the initial switching frequency f memorized in the initial value setting unit 12; and the AD offset value and the DA offset value memorized in the AD/DA offset setting unit 4 etc. The new peak current value Y11 is output as a digital signal called IPEAKSET from the peak current calculation circuit 3, and then is supplied to the D/A conversion circuit 5. The IPEAKSET is subjected to the D/A conversion in the D/A conversion circuit 5, and then is output as an analog signal called IDAC to be used as new threshold voltage of the comparator 1.

Since an output IPEAKDET of the comparator 1 becomes a high level signal when the current ISENS (voltage Vsens) exceeds the new threshold voltage IDAC of the comparator 1, an output SWON signal which passes through the subsequent logic circuit 7 and the RS flip-flop 8 etc. becomes a low level signal, and then becomes a high level signal by changing its DC voltage level by the level shift unit 9. The aforementioned high level signal becomes a low level signal by the inverter composed of the next FETs 10 and 11, and then the FET 55 turns OFF. That is, if it explains using the signal shown in FIG. 13, the FET 55 is turned OFF in timing (5) to which the current ISENS exceeded the new peak current value Ipeak. The sampling mode, the A/D conversion mode, and the compute mode shown in FIG. 12 are repeated in this manner.

As mentioned above, the peak current value set up in the switching current control circuit is changed each time according to the linear increasing rate (percentage increases) of the Isen which is the detected current. Regarding the change of the peak current value, the maximum current value in the case of reaching the end time of the ON period of switching cycle initially set up is made into the new peak current value, while the linear increasing rate of the detected current Isen kept. Therefore, although the ON/OFF cycle of switching operation is changed, the ON period of switching operation is not changed from the initial setup, and is in the state of being fixed. According to the above-mentioned operation, even if the increasing rate of the detected current is changed, the integral value of the current which flows through the light emitting diode can be kept at an almost constant value. Accordingly, the average current value which flows through the load is not changed.

Figure 14:
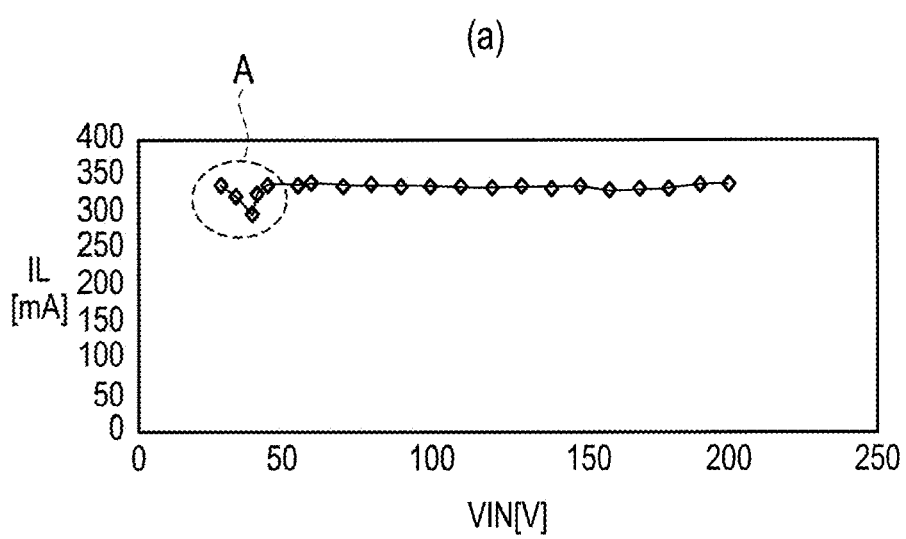
[FIG. 14] (a) A diagram showing input voltage characteristics in an evaluation connecting configuration using the switching current control circuit according to the present invention, and (b) a diagram showing a configuration in which a switching current control circuit 100 according to the present embodiment is disposed on an evaluation substrate, and a variable DC power supply VIN and a light emitting diode 52 for input voltage are connected thereto.
Figure 14:
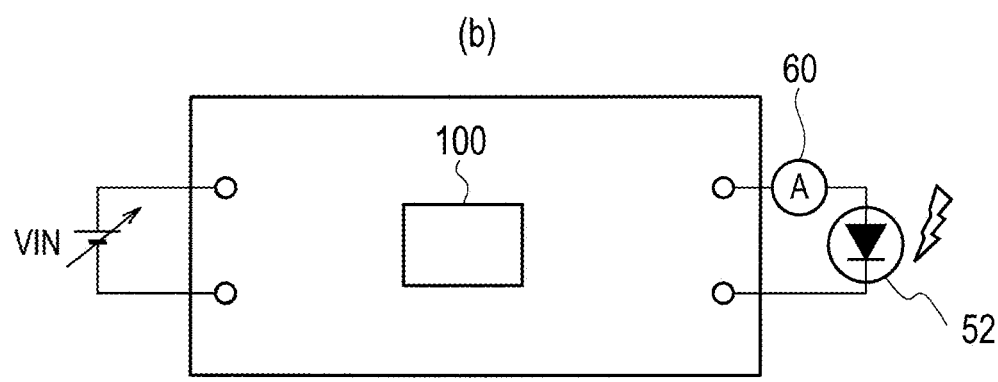

An experiment has confirmed the above-mentioned fact. As shown in FIG. 14(*b*), the switching current control circuit 100 according to the present embodiment is disposed on an evaluation substrate, and the variable DC power supply VIN and the light emitting diode 52 for input voltage are connected thereto. That is, a component of the DC power supply 51, the light emitting diode 52, the inductor 53, the FET 55, and the current sensing resistor 56 shown in FIG. 8 is used in that condition, and a circuit configuration using a variable DC power supply VIN instead of the DC power supply 51 was adopted. Six pieces of 1-watt LEDs connected in series was used for the light emitting diode 52.

Here, the input voltage VIN was changed, and then the current IL which flows through the light emitting diode 52 was measured with the ammeter 60. The result thereof is shown in FIG. 14(*a*). The horizontal axis of FIG. 14(*a*) indicates the VIN(V), and the vertical axis indicates the current IL (mA). The current IL was hardly changed, with respect to the change of the input voltage VIN, and therefore a desirable result was obtained. The change in the area A is due to the maximum duty cycle (50%) as a limit, and proves no problem.

Figure 15:
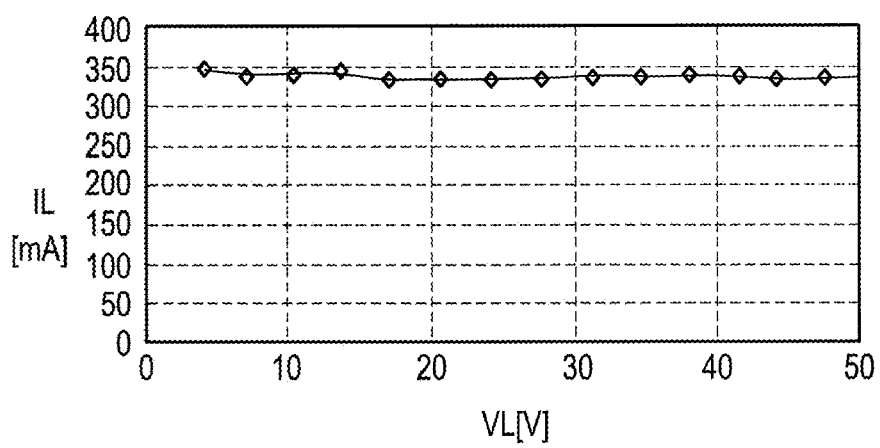
[FIG. 15] (a) A diagram showing input voltage characteristics in an evaluation connecting configuration using the switching current control circuit according to the present invention, and (b) a diagram showing a configuration in which a power supply is changed from the variable DC power supply VIN to AC power supply of 100 V to use the power supply as input voltage by changing from the AC power supply to DC voltage, although the connection of the circuit element is fundamentally same as that shown in FIG. 14 (b).
Figure 15:
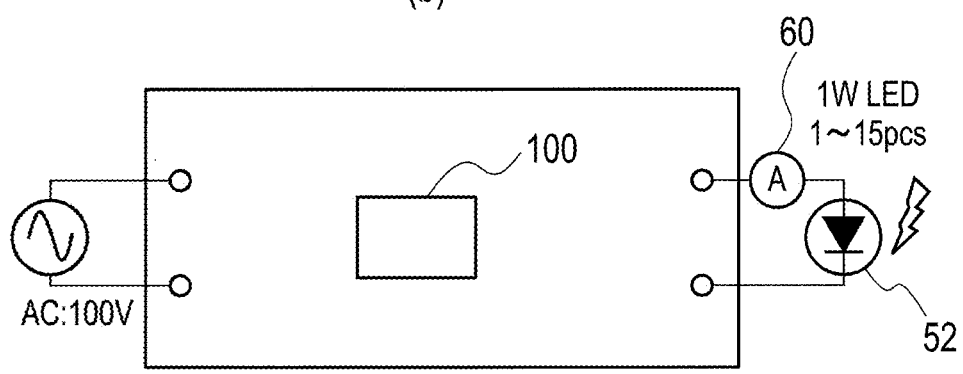

FIG. 15(*b*) is a diagram showing a configuration in which a power supply is changed from the variable DC power supply VIN to AC power supply of 100 V to use the power supply as input voltage by changing from the AC power supply to DC voltage, although the connection of the circuit element is fundamentally same as that shown in FIG. 14(*b*). Moreover, fifteen pieces of 1-watt LEDs connected in series was used for the light emitting diode 52. The test result thereof is shown in FIG. 15(*a*). In FIG. 15(*a*), the horizontal axis indicates the DC input voltage VL (V), and the vertical axis indicates the current IL (mA) which flows through the light emitting diode 52. Even if the input voltage VL was changed, there was almost no change in the current IL, and therefore a desirable result was obtained.

Figure 16:
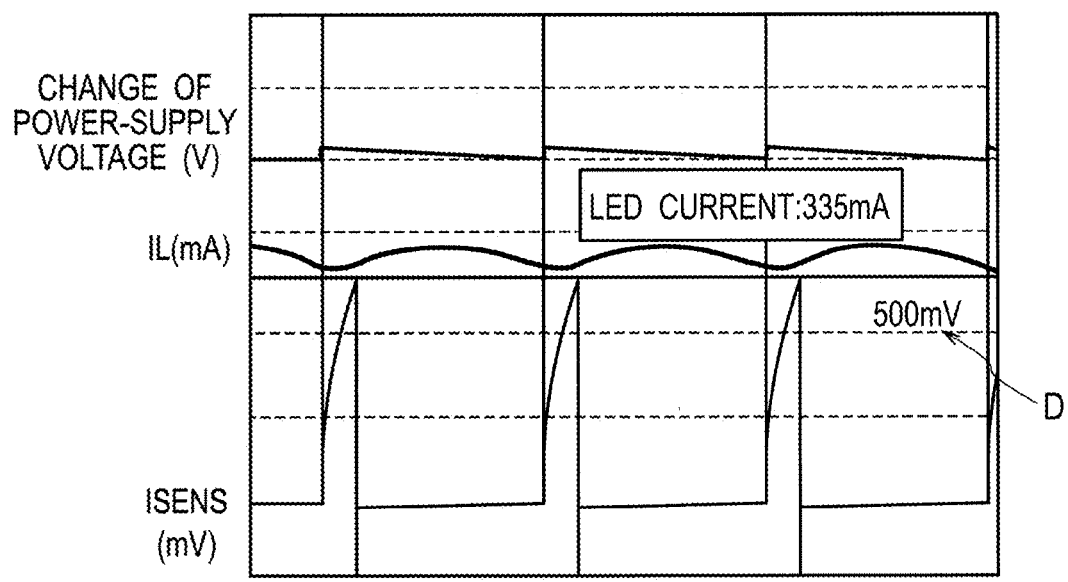
[FIG. 16] A diagram showing a relationship between supply voltage variation, load current, and a detected current.

FIG. 16 shows a supply voltage variation in the structure shown in FIG. 14 or 15, and a result of measuring respectively the current IL which flows through the LED and the voltage ISENSE input into the comparator 1. One scale is equivalent to 5 V in the supply voltage variation, and one scale is equivalent to 200 mV in the voltage ISENSE. In this case, the average of the voltage ISENSE is returned so as to be 500 mV (line D in FIG. 16). As proved also in FIG. 16, even if the supply voltage is varied, the average current of IL is kept at 335 mA.

Figure 17:
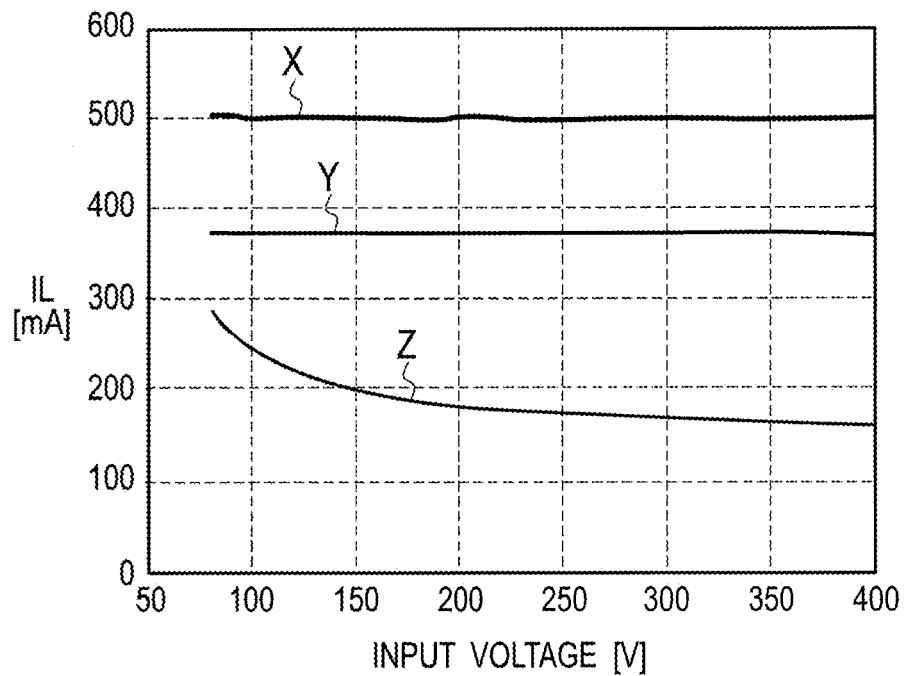
[FIG. 17] A diagram showing a comparison between input voltage characteristics of the switching current control circuit according to the present invention and input voltage characteristics of a conventional switching current control circuit.

FIG. 17 is a diagram showing a comparison between a result of having measured the current IL which flows through the light emitting diode by changing the input voltage, composing a structure as shown in FIG. 14 or 15 using the switching current control circuit according to the present invention (input voltage characteristics X), and a result of having measured the current IL which flows through the light emitting diode by changing the input voltage similarly, composing structures as shown in FIG. 14 or 15 using conventional switching current control circuits of other company products (input voltage characteristics Y and Z). The current sensing resistor 56 was set to 1 ohm upon the measuring. The vertical axis indicates the current IL (mA) and the horizontal axis indicates the input voltage (V).

As proved from the input voltage characteristics X using the switching current control circuit according to the present embodiment, a constant current flows through the light emitting diode even if the input voltage is changed. On the other hand, in the input voltage characteristics using the switching current control circuit according to the comparative example, it is not preferred that the current which flows through the light emitting diode is decreased with the change of the input voltage, in particular in the characteristics Z. Thus, according to the present embodiment, since the current which flows through the light emitting diode is constant with respect to the input voltage, the power factor can be improved, and the flicker can be prevented. Accordingly, it is applicable to a power factor correction (PFC) circuit, a circuit without an electrolytic capacitor, etc.

Figure 18:
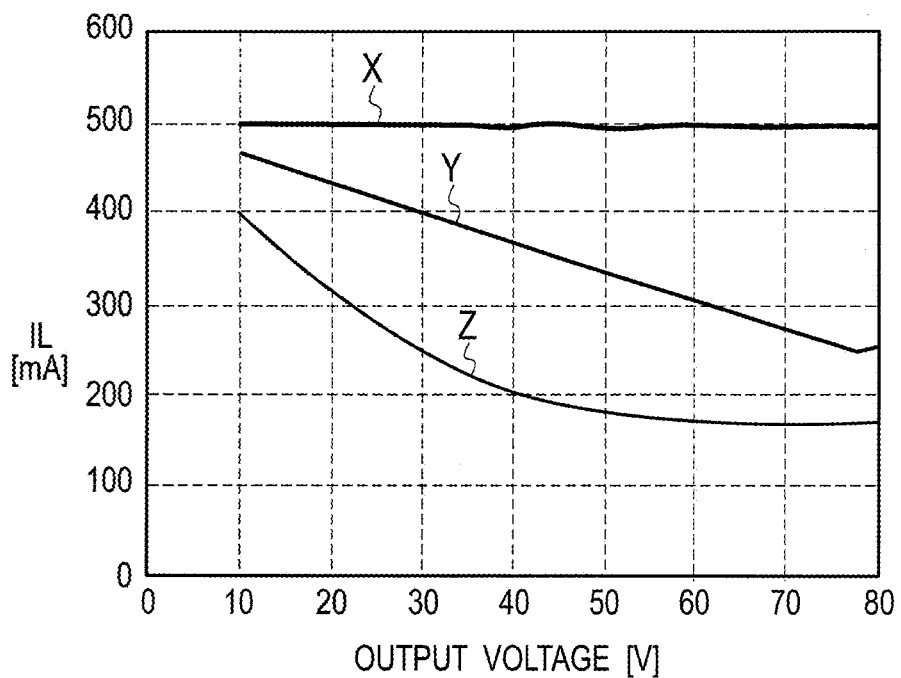
[FIG. 18] A diagram showing a comparison between output voltage characteristics of the switching current control circuit according to the present invention and output voltage characteristics of the conventional switching current control circuit.

FIG. 18 shows a result of having measured relationship (output voltage characteristic) between the current IL which flows through the light emitting diode and the output voltage of the light emitting diode, in the measurement shown in FIG. 17. The vertical axis indicates the current IL (mA) and the horizontal axis indicates the output voltage (V). As proved from the output voltage characteristics X using the switching current control circuit according to the present embodiment, a constant current flows through the light emitting diode even if the input voltage is changed, and the output voltage is also kept constantly. On the other hand, the current IL is decreased if the output voltage becomes larger, in both characteristics Y and Z that are a test results using the switching circuit according to the comparative example.

Thus, it is proved that the current IL is not affected by the volume of the voltage drop in the light emitting diode, according to the switching current control circuit 100 according to the present embodiment. Accordingly, the switching current control circuit 100 according to the present embodiment can be applied also in the case of using a plurality of various LED connected in series.

As mentioned above, according to the switching current control circuit 100 of the present embodiment, as for the average current which flows through the light emitting diode, even if the voltage Vin of the DC power supply 51 and the voltage of the light emitting diode 52 are dropped, and inductance L of the inductor 53 is changed, the peak current value is changed in accordance with the increasing rate of the detected current Isen (ISENSE), and the ON period of the switching period is not changed, as mentioned above. Accordingly, the average current which flows through the light emitting diode is not affected from any elements other than the current sensing resistor 56 used as an external resistor. Accordingly, the average current value which flows through the light emitting diode can be suitably set up by changing only the external resistor.

That is, the linear increasing rate of the detected current in the ON period of the switching pulse is calculated, the maximum current value at the time of assuming that the detected current is increased until the end of the ON period of switching operation is calculated using the increasing rate, and then the maximum current value is replaced to the peak current value.

That is, the peak current value input into the comparator circuit is changed in accordance with the linear increasing rate of the detected current, the peak current value also becomes larger as the linear increasing rate of the detected current becomes larger, and the peak current value also become smaller as the linear increasing rate of the detected current becomes smaller. For example, even if the linear increasing rate of the detected current becomes larger, the ON/OFF cycle becomes shorter, and the ON period becomes shorter, since the peak current value becomes larger and thereby the maximum of the load current is increased, the average current can be kept constant.

[Third Embodiment]

There will be explained an LED dimmer system S and an LED illumination device according to a third embodiment, with reference to FIGS. 19-29.

(LED Dimming Method)

Figure 19:
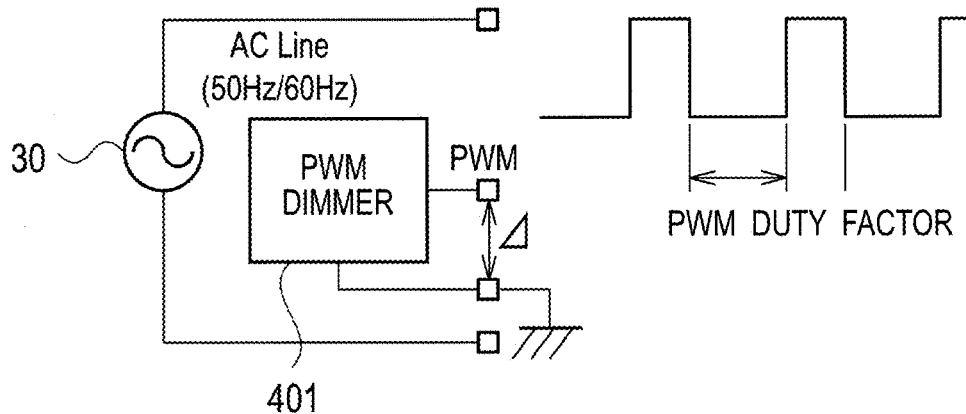
[FIG. 19] An explanatory diagram showing a PWM dimming method, and a graph showing a PWM dimming curve.
Figure 19:
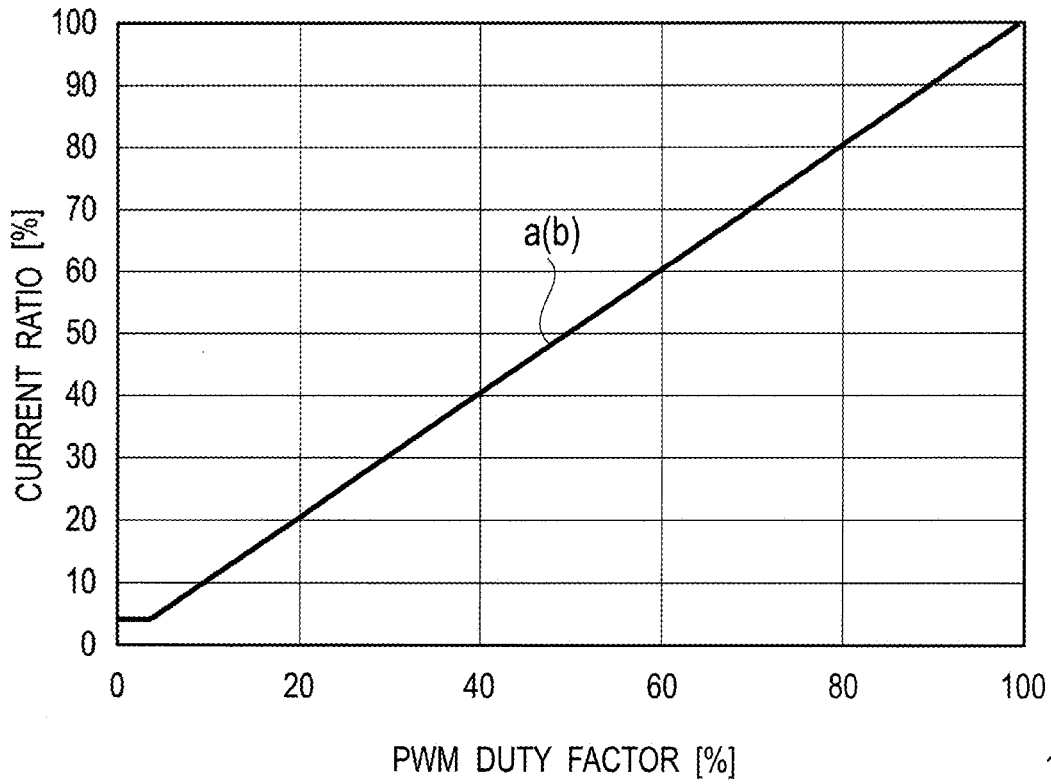

In the first place, an LED dimming method will now be briefly explained with reference to FIGS. 19-21.

The LED dimming methods are roughly classified into three kinds, a pulse width modulation (PWM) dimming, a phase dimming (triac dimming), and a linear dimming.

The PWM dimming is a method which adjusts luminosity by controlling between a lighting period and an extinction period of LED. Actually, the luminosity is controlled by adjusting a duty ratio (i.e., ratio between ON time and OFF time) of a PWM signal output from a PWM dimmer 401, as shown in FIG. 19.

However, if a frequency which repeats lighting and extinction is lower, it will sense in human being's eyes as a "flicker." Therefore, it is necessary to fully increase the frequency of the PWM signal. It may be set as approximately 200 Hz in the case of purpose of a common illumination device, a back light in a liquid crystal panel, etc. On the other hand, there is a high possibility that interference fringes will appear in an obtained image at approximately 200 Hz, in use of a machine vision used for a production line etc. It is necessary to set it highly as approximately 1 kHz for such a purpose.

In the graph showing the PWM dimming curve, the curves a, b (both curves is substantially overlapped to each other in FIG. 19) indicate a relationship between the PWM duty factor and the current ratio, in the case of a DC output and in the case of a burst output.

In this case, there are a voltage dimming method for performing dimming by changing a voltage (or current) supplied to the LED, and, a burst dimming method for turning ON a lamp intermittently using a PWM pulse, as a method for controlling the luminosity of the LED. The above-mentioned curve a indicates the case of the voltage dimming method, and the above-mentioned curve b indicates the case of the burst dimming method, respectively.

Figure 20:
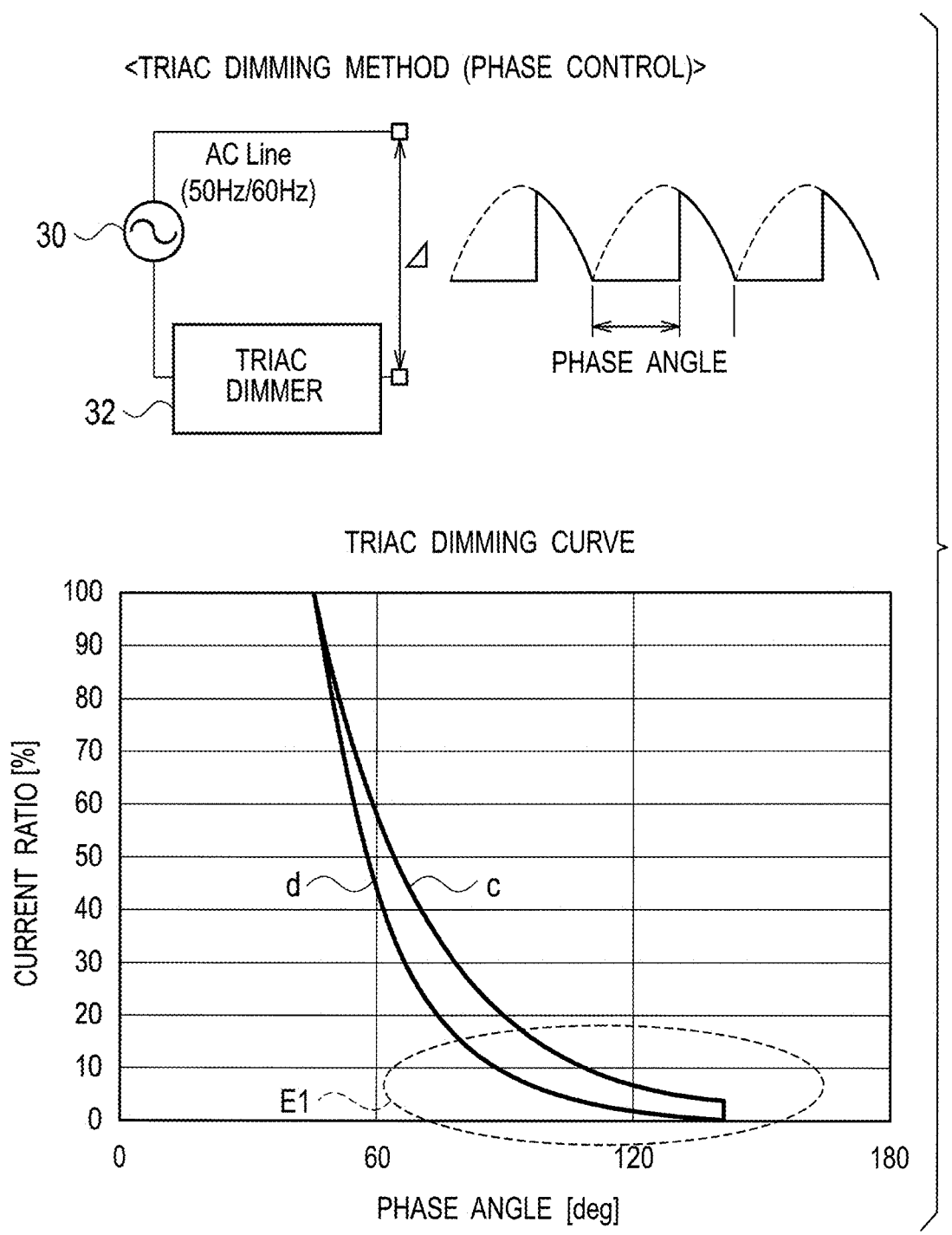
[FIG. 20] An explanatory diagram showing a PWM dimming method, and a graph showing a PWM dimming curve.

On the other hand, the triac dimming adjusts the luminosity by controlling timing (phase angle) for providing a trigger to a triac with which a triac dimmer 32 is provided, as shown in FIG. 20.

The triac dimming is a method mainly used for a lightness adjustment of illumination devices installed in general residences. It is a mechanism of adjusting the luminosity by cutting out a part of input AC using a triac having a structure in which thyristors are combined face to face with each other (in inverse parallel).

In more details, if a trigger is provided to the triac in the middle of an alternating current waveform, a diode is shifted to a conduction state (ON state), and that state will continue until the alternating current waveform becomes 0 V.

Timing for providing the trigger, i.e., an angle which cuts out the alternating current waveform, is controlled to adjust the luminosity. It will become brighter as the timing for providing the trigger becomes earlier (i.e., as the angle is smaller), but it will become darker as the timing is later (i.e., as the angle is larger).

The feature of the triac dimming is high compatibility with an incandescent electric lamp in which luminosity is determined with an actual value of supplied power.

In the graph of the triac dimming curve, the curve c indicates the case of the DC output and the curve d indicates the case of the burst output. Note that, in the graph of the triac dimming curve, the area E1 indicates a range suitable for the dimming in accordance with the sensitivity of human beings' eyes.

Figure 21:
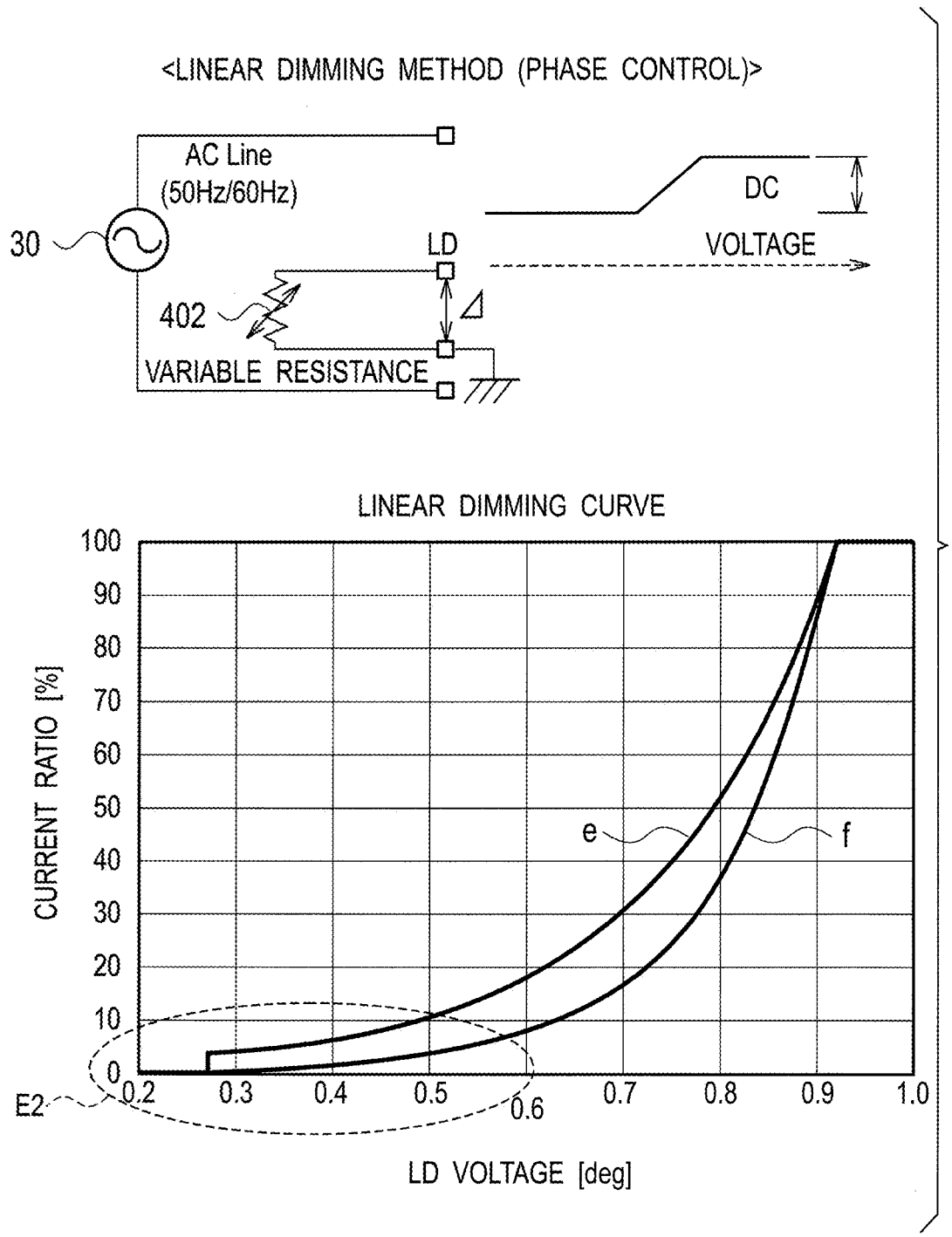
[FIG. 21] An explanatory diagram showing a linear dimming method, and a graph showing a linear dimming curve.

Moreover, the linear dimming is a method for dimming by changing the DC voltage with a variable resistor 402 (e.g. a volume resistor, a slide resistor, etc.), as shown in FIG. 21.

In the graph of the linear dimming curve, the curve e indicates the case of the DC output and the curve f indicates the case of the burst output. Note that, in the graph of the linear dimming curve, the area E2 indicates a range suitable for the dimming in accordance with the sensitivity of human beings' eyes.

In this case, the triac dimmer 32 needs to feed a holding current continuously when the triac turns ON, and the triac will turn it off if the holding current becomes lower than a threshold value.

That is, if the holding current for the triac with which the triac dimmer is provided becomes lower than the threshold value due to an electric discharge in a smoothing capacitor, etc., the triac is turned OFF, and the triac is turned OFF again due to the same reason even if the triac is turned ON again.

If such the ON/OFF states are repeated, a flicker which is a leading cause of LED user discomfort occurs.

The LED dimmer system S according to the third embodiment includes a bleeder resistor R1 connected to an output side of the triac dimmer 32, and a bleeder control unit 21 which controls a current which flows through the bleeder resistor R1.

(LED Dimmer System According to Third Embodiment)

The LED dimmer system S according to the third embodiment including the switching current control circuit 100 according to the first or second embodiment, the LED dimmer system S performing dimming of the LED 52, the LED dimmer system S including: a bridge type full wave rectifying circuit 31 connected to one end side of an AC power supply 30; a triac dimmer 32 connected to other end side of the AC power supply 30; a bleeder resistor R1 connected to an output side of the triac dimmer 32; and a bleeder control unit 21 for controlling a current which flows through the bleeder resistor R1.

The bleeder control unit 21 controls a predetermined holding current which holds ON state to be supplied to the triac dimmer 32 via the bleeder resistor R1.

Here, there will be explained an entire configuration of the LED dimmer system S, with reference to the block diagram shown in FIG. 22.

Figure 22:
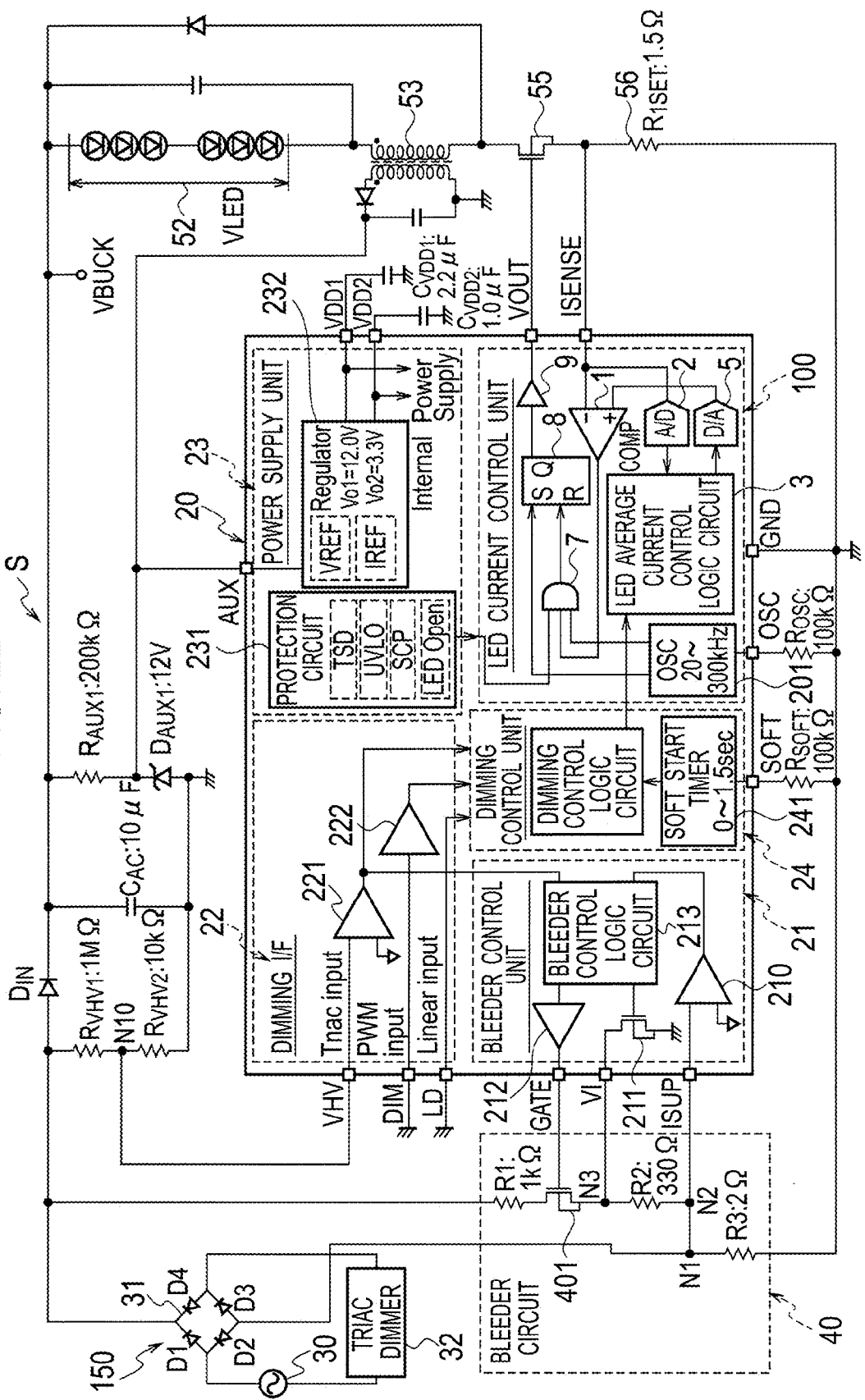
[FIG. 22] A block diagram showing an example of structure of an LED dimmer system.

The LED dimmer system S is broadly grouped under a control unit 20 for managing control of the whole system; an LED (a plurality of LEDs are connected in series, in an example shown in FIG. 22) 52 which lights up in accordance with the control of the control unit 20; a dimming unit 150 for triac dimming of the LED 52; a bleeder circuit 40 which supplies a holding current for a triac dimmer 32 with which the dimming unit 150 is provided; and other circuit structural components.

The control unit 20 includes: the switching current control circuit 100 according to the first or second embodiment; a bleeder control unit 21 for controlling the bleeder circuit 40, a dimming interface unit 22 which selects triac dimming, PWM dimming, or linear dimming; a power supply unit 23 which supplies a current to the whole system; and a dimming control unit 24 which performs dimming control.

FIG. 22 shows a schematic structure of the switching current control circuit 100. Since the description of the first or second embodiment has described a detailed structure of the switching current control circuit 100, the explanation of the switching current control circuit 100 is omitted, attaching same reference numeral to the same structural member. The OSC 201 is an oscillator which generates 20-30-kHz signals.

The bleeder control unit 21 includes: a bleeder control logic circuit 213 which outputs a logical operation result to a NOT circuit 212 connected to a gate electrode of a switching element TR2 mentioned below; an operational amplifier 210 connected to a control resistor R2 and a monitor resistor R3 mentioned below, and inputting an amplified signal to the bleeder control logic circuit 213; and an FET 211 of which a drain electrode is connected to the control resistor R2, and a gate electrode is connected to the bleeder control logic circuit 213.

The dimming interface unit 22 includes an operational amplifier 221 connected to the triac input side, a NOT circuit 222 connected to the PWM input side, and a linear input terminal LD, in which the operational amplifier 221, the NOT circuit 222, and the linear output terminal are connected to the dimming control unit 24.

The dimming interface unit 22 functions as a switching unit for switching a first dimming mode for performing phase dimming using the triac dimmer 32, a second dimming mode for performing PWM dimming, and a third dimming mode for performing linear dimming using a variable resistor.

The power supply unit 23 includes a protection circuit 231, and a power supply unit 232 which supplies a power supply of 12 V and 3.3V.

The protection circuit 231 has functions, e.g. LED open/short protection, supply voltage failure protection, temperature anomaly protection, detection-terminal open/short protection, etc.

The dimming control unit 24 includes: a dimming control logic circuit 242 which controls the triac dimming, the PWM dimming, and the linear dimming, and a soft start timer 241 which lights up the LED 52 gently.

The dimming unit 150 includes: alternating current power supply (AC power supply) 30; abridge type full wave rectifying circuit 31 composed of abridge diode connected to one end side of the AC power supply 30; a triac dimmer 32 connected to other end side of the AC power supply 30; and a bleeder resistor R1 connected to an output side of the triac dimmer 32.

90-256 V power source is applied as the AC power supply.

A control resistor R2 and a monitor resistor R3 mentioned below are connected to anodes of the diodes D2 and D3 in the bridge diode composing the bridge type full wave rectifying circuit 31.

Cathodes of the diodes D1 and D4 in the bridge diode composing a bridge type full wave rectifying circuit 31 are connected to the LED 52 via the diode $D_{IN}$.

The bleeder circuit 40 includes: the bleeder resistor R1 connected to a drain electrode of the FET 401 as a switching element; the control resistor R2 connected to a source electrode of the FET 401; and the monitor resistor R3 connected to the control resistor R2 via a node N1.

The control resistor R2 and the monitor resistor R3 are connected to the operational amplifier 210 in the bleeder control unit 21 via a node N2.

The bleeder resistor R1 is a resistor which supplies a holding current to the triac in the triac dimmer 32 via the bridge type full wave rectifying circuit 31, and a resistance value is 1 kΩ in the present embodiment.

The source electrode of the FET 401 and the control resistor R2 are connected via a node N3 to the drain electrode of the FET 211 with which the bleeder control unit 21 is provided. In the present embodiment, a resistance value of the control resistor R2 is 330Ω.

The monitor resistor R3 is a resistor for monitoring the holding current supplied to the triac in the triac dimmer 32. In the present embodiment, a resistance value of the monitor resistor R3 is 2Ω.

Moreover, boost resistors $R_{VHV1}$, $R_{VHV2}$ etc. are connected to a triac input terminal VHV in the dimming interface unit 22 via a node N10.

(Bleeder Control)

There will now be explained bleeder control performed by the bleeder control unit 21 and the bleeder circuit 40, with reference to FIGS. 23-25.

The bleeder control unit 21 controls the bleeder current supplied from the bleeder circuit 40 by performing ON/OFF control of the FET 401 in accordance with a value of the current which flows through the monitor resistor R3, thereby preventing malfunctions of the triac dimmer 32. Accordingly, a flicker of the LED 52 is eliminated.

Figure 23:
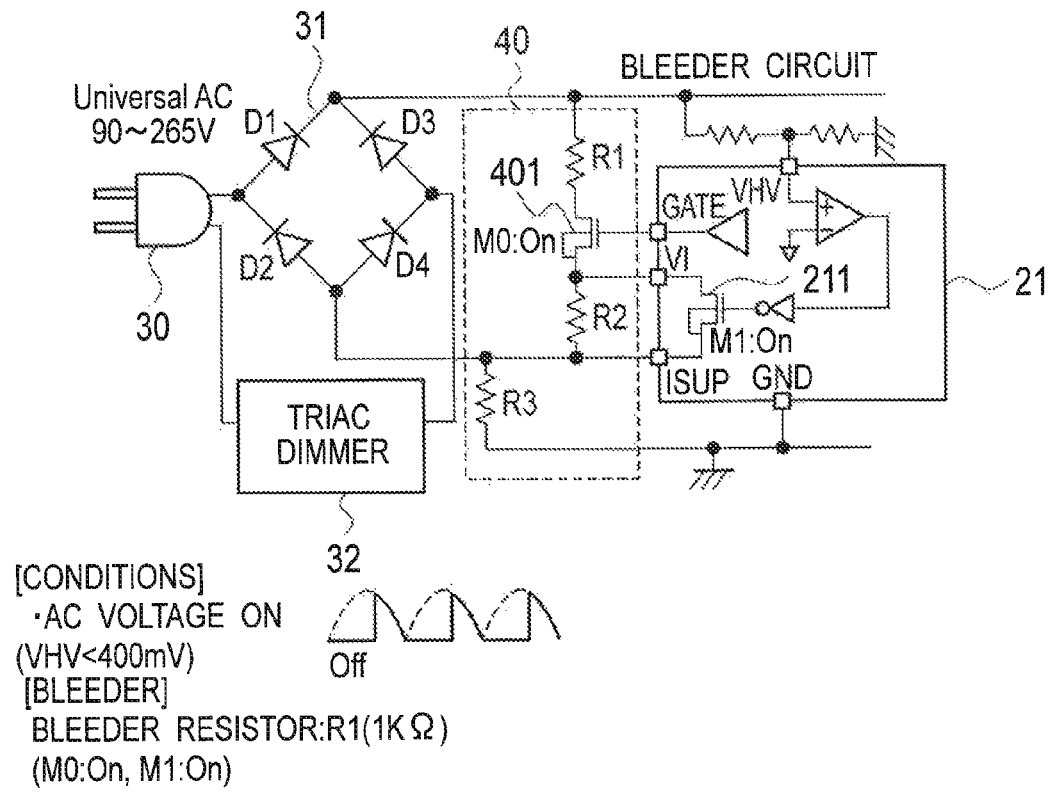
[FIG. 23] An explanatory diagram showing an example of operation of bleeder control.

The conditions of the case shown in FIG. 23 are AC voltage of the AC power supply 30 is ON, and the voltage VHV<400 mV. In this case, both of the FET 211 and the FET 401 are turned ON, and are controlled so that sufficient current is supplied to the triac in the triac dimmer 32 via the bleeder resistor R1 and the control resistor R2.

Figure 24:
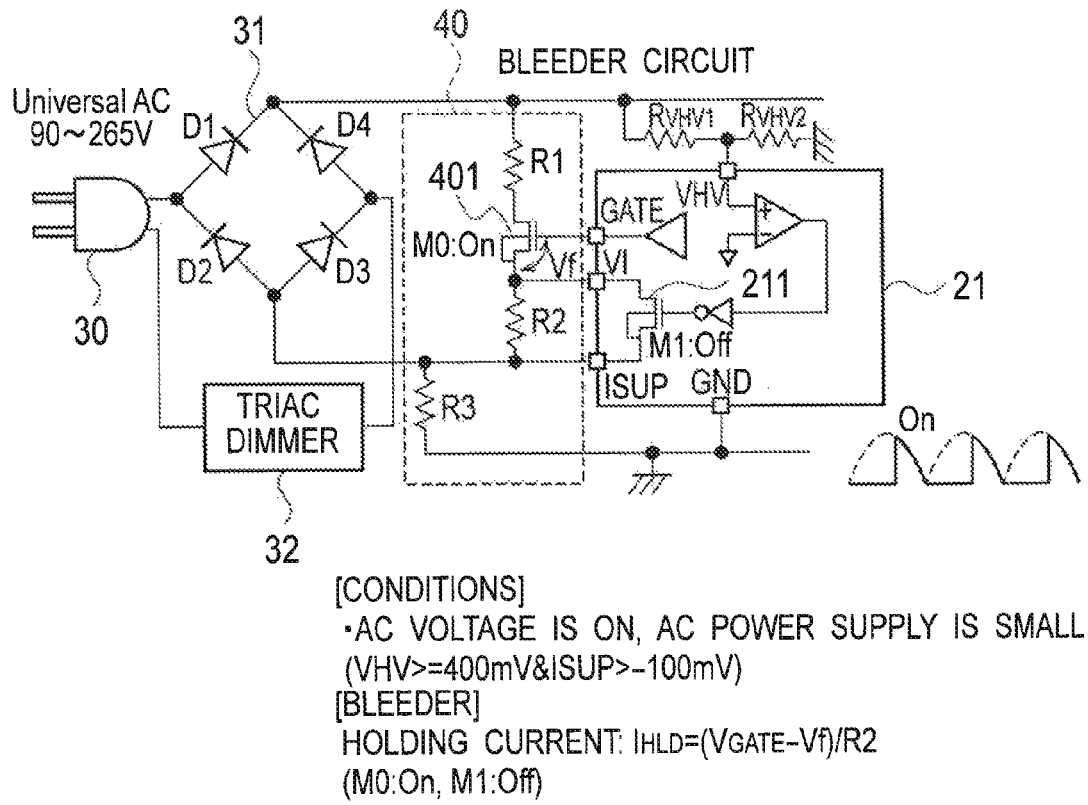
[FIG. 24] An explanatory diagram showing another example of operation of bleeder control.

The conditions in the case shown in FIG. 24 are the voltage of the AC power supply 30 is ON, and a value of the AC current is smaller (e.g., the voltage VHV>=400mV, and ISUP>−100mV). In this case, the FET 211 is turned OFF, and the FET 401 is turned ON.

The holding current $I_{HLD}$ in this case is as follows, $I_{m-D}$=$(V_{GATE}-Vf)/R2$=(12 [V]−2 [V])/330[Ω]=approximately 30 mA.

Note that the holding current $I_{HLD}$ can be 20-50 mA by changing the resistance value of the control resistor R2 etc.

According to the holding current $I_{HLD}$, the triac in the triac dimmer 32 can hold the ON state, thereby preventing a flicker of the LED 52.

Figure 25:
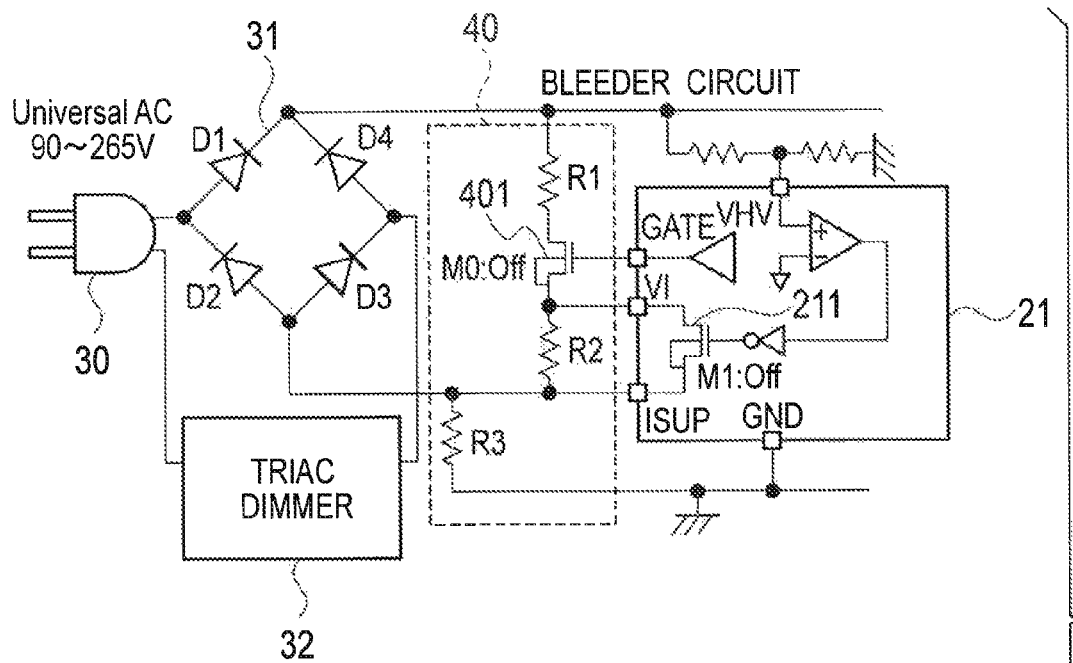
[FIG. 25] An explanatory diagram showing still another example of operation of bleeder control.
Figure 25:
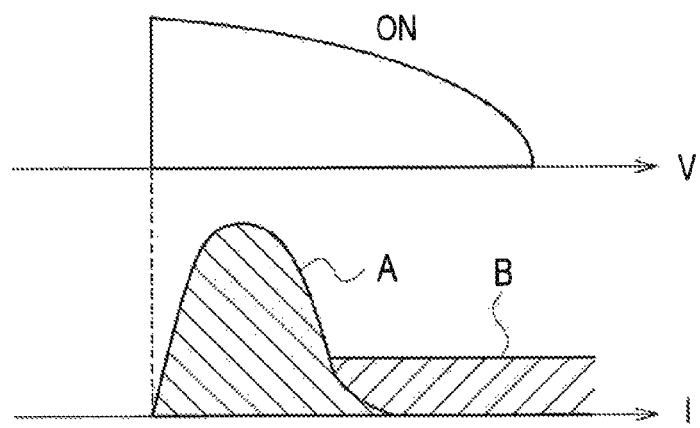

The conditions in the case shown in FIG. 25 are the voltage of the AC power supply 30 is ON, and a value of the AC current is larger (e.g., the voltage VHV>=400 mV, and ISUP<=−100 mV). In this case, both of the FET 211 and the FET 401 are turned OFF.

In this case, the holding current B holding the ON state of triac flows even if the current A supplied to the triac in the triac dimmer 32 is gradually decreased as shown in FIG. 25.

Accordingly, the triac can hold the ON state, thereby preventing a flicker of the LED 52.

(Applicability to LED Illumination Device)

As illumination devices using the LED 52, there are a ceiling lamp (ceiling light type LED illumination device) disposed on ceilings, e.g. a living room, a bulb type lamp (bulb type LED illumination device) used replacing with an incandescent lamp, a spotlight type LED illumination device, etc.

Figure 26:
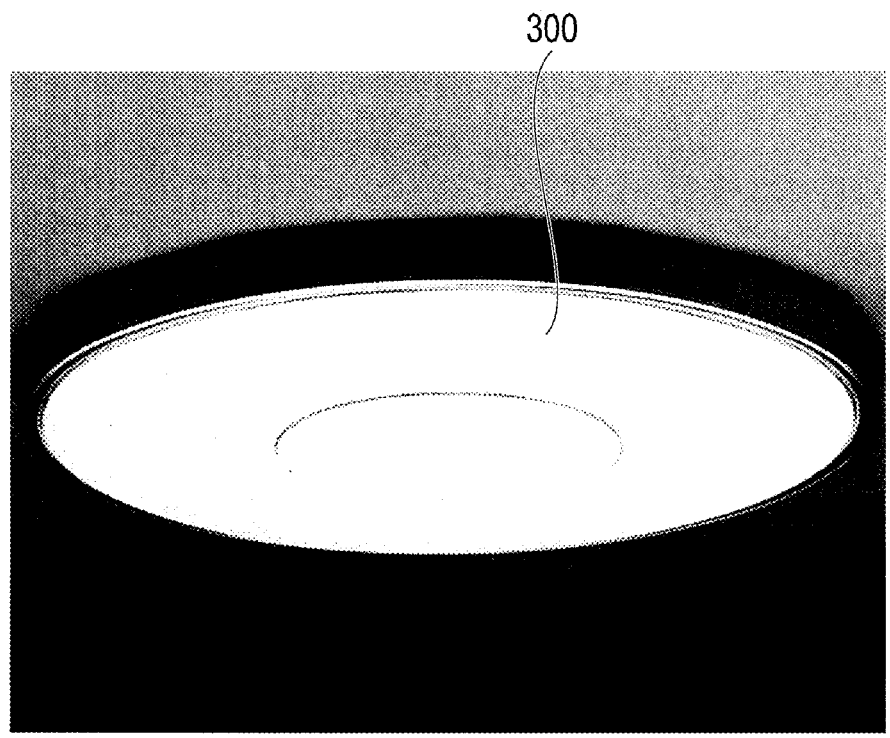
[FIG. 26] An imaging diagram showing a ceiling light type LED illumination device.

FIG. 26 shows am example of the ceiling light type LED illumination device 300. The ceiling light type LED illumination devices 300 has, for example, electric power consumption (41 W), light colors (daylight+warm white), luminaire light flux (3220 lm), applicable number of tatami mats (8 mats), width (500 mm), depth (500 mm), height (39 mm), and weight (2.8 kg).

Figure 29:
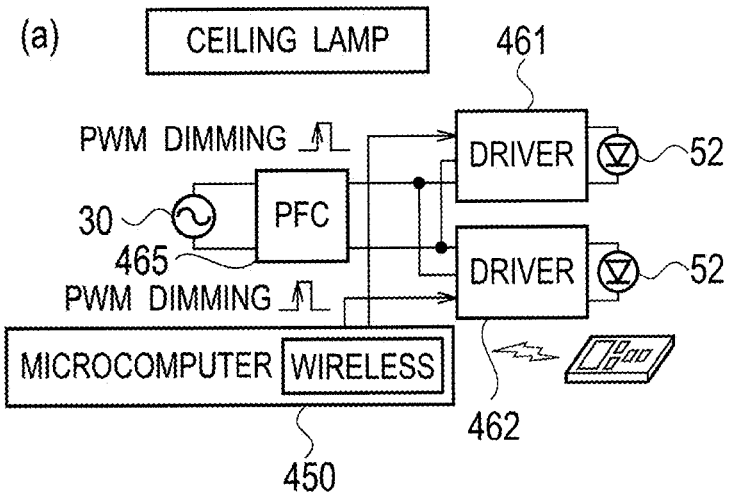
[FIG. 29] (a) An explanatory diagram showing an example of control of the ceiling light type LED illumination device, (b) an explanatory diagram showing an example of control of the bulb type LED illumination device, and (c) an explanatory diagram showing an example of control of a spotlight type LED illumination device.
Figure 29:
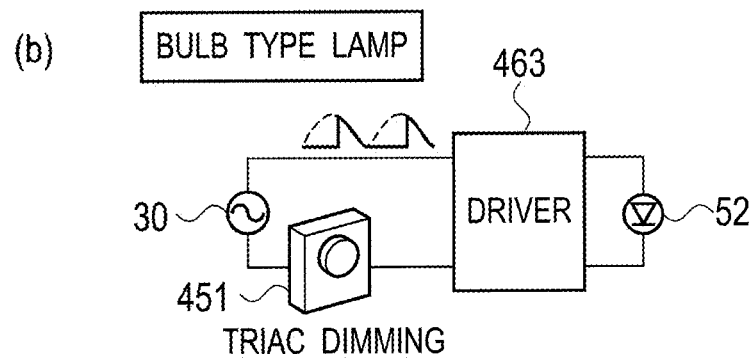
Figure 29:
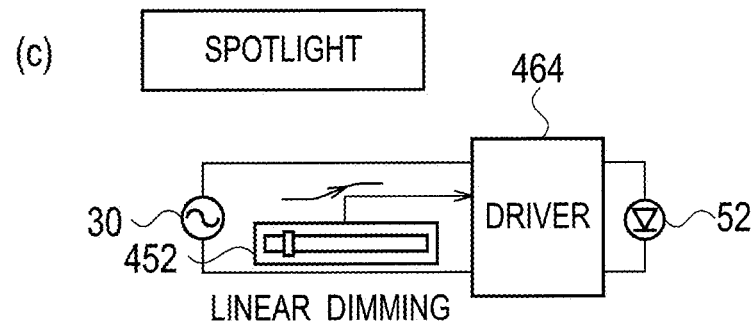

As shown, for example in FIG. 29(*a*), the PWM dimming method can be used for the ceiling light type LED illumination device 300.

As shown in FIG. 29(*a*), the ceiling light type LED illumination device 300 includes a power factor correction (PFC) circuit 465, drivers 461, 462, a microcomputer 450 for controlling the device with wireless operation, etc.

In the case of applying the LED dimmer system S according to the present embodiment to the ceiling light type LED illumination device 300, the dimming interface unit 22 is controlled to switch the dimming mode to the second dimming mode for performing the pulse width modulation dimming.

Figure 27:
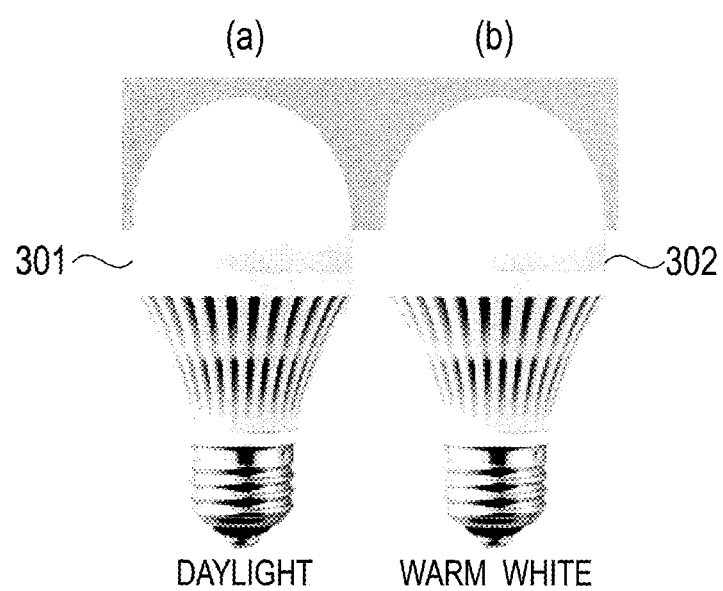
[FIG. 27] An imaging diagram showing a bulb type LED illumination device.

FIG. 27 shows examples of the bulb type LED illumination devices 301, 302.

The bulb type LED illumination device 301 shown in FIG. 27(*a*) emits a light of daylight, and the bulb type LED illumination device 301 shown in FIG. 27(*b*) emits a light of warm white.

Each bulb type LED illumination device 301, 302 is configured to be electric power consumption (6 W), light flux (390 lm), life time (40000 hours), and the base standard (E26).

In the case of applying the LED dimmer system S according to the present embodiment to the bulb type LED illumination devices 301 and 302, the dimming interface unit 22 is controlled to switch the dimming mode to the first dimming mode for performing the phase dimming using the triac dimmer 32. That is, the triac dimming is performed using the driver 463 to which the LED dimmer system S is applied, as schematically shown in FIG. 29(*b*).

Accordingly, a malfunction of the triac dimmer 32 is prevented as mentioned above, and a flicker of the bulb type LED illumination devices 301, 302 is also prevented.

Figure 28:
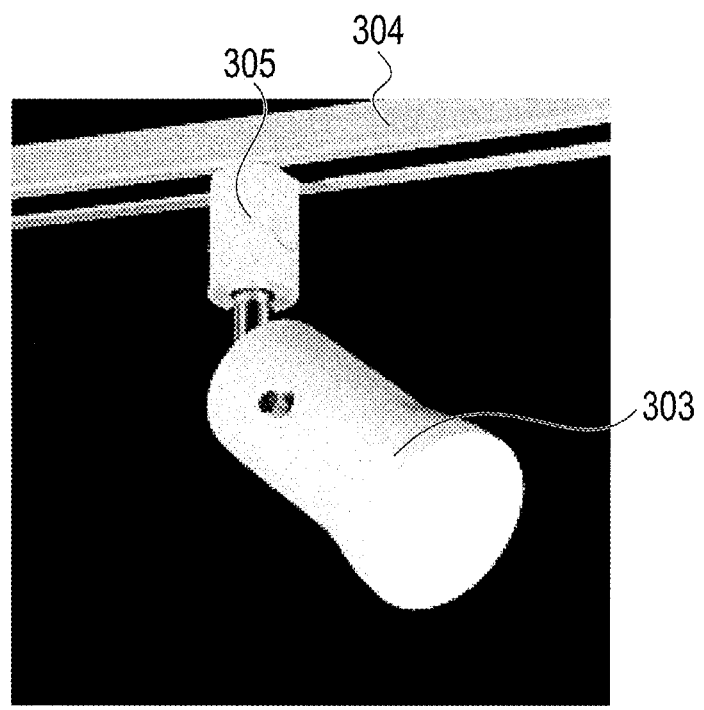
[FIG. 28] An imaging diagram showing a spotlight type LED illumination device.

FIG. 28 shows an example of the spotlight type LED illumination device 303.

The spotlight type LED illumination device 303 is movably attached to a rail 304 via a fixture 305.

The spotlight type LED illumination device 303 us configured to be electric power consumption (4 W), light flux (256 lm), and the base standard (E17), for example.

In the case of applying the LED dimmer system S according to the present embodiment to the spotlight type LED illumination device 303, the dimming interface unit 22 is controlled to switch the dimming mode to the third dimming mode for performing the linear dimming using the variable resistor.

For example, as shown in FIG. 29(*c*), the dimming control is performed using a slide resistor 452 and a driver 464.

[Other Embodiments]

While the present invention is described in accordance with the aforementioned embodiment, it should be understood that the description and drawings that configure part of this disclosure are not intended to limit the present invention. This disclosure makes clear a variety of alternative embodiments, working examples, and operational techniques for those skilled in the art.

INDUSTRIAL APPLICABILITY

The switching current control circuit according to the present invention is applicable to a device which performs constant current drives, e.g. LED, an integrated circuit for drivers of devices driven with constant current, etc.

Moreover, the LED dimmer system according to the present invention is applicable to a bulb type LED illumination device or a ceiling light type LED illumination device.

REFERENCE SIGNS LIST

1, 14, 57: Comparator
2: A/D converter
3: Arithmetic control circuit
4: AD/DA offset setting unit
5: D/A conversion circuit
5*a*: DAC decoder
5*b*: R-2R ladder D/A converter
6: Timing control circuit
7: Logic circuit
8, 58: RS flip-flop
9: Level shift unit
10, 11, 55, 211, 401: FET
12: Initial value setting unit
13: Frequency setting unit (frequency setting circuit)
15: Frequency counter
20: Control unit 21: Bleeder control unit
22: Dimming interface unit
23: Power supply unit
24: Dimming control unit
30: AC power supply
31: Bridge type full wave rectifying circuit
32: Triac dimmer
40: Bleeder circuit
51: DC power supply
52, 53: Light emitting diode
54: Diode
56: Current sensing resistor
60: Ammeter
70, 100: Switching current control circuit
90: Switching pulse supply circuit
91: Comparator circuit
100a: Analog circuit unit
100b: Digital circuit unit
150: Dimming unit
201: OSC
210, 221: Operational amplifier
212, 222: NOT circuit
213: Bleeder control logic circuit
231: Protection circuit
232: Power supply unit
241: Soft start timer
242: Dimming control logic circuit
300: Ceiling light type LED illumination device
301: Bulb type LED illumination device
303: Spotlight type LED illumination device
304: Rail
305: Fixture
401: PWM dimmer
402: Variable resistor
450: Microcomputer
452: Slide resistor
461, 463, 464: Driver
465: PFC circuit

The invention claimed is:

1. A switching current control comprising:
a DC power supply;
a light emitting diode having an anode is connected to the DC power supply;
an inductor having one end connected to a cathode of the light emitting diode;
a diode having an anode connected to another end of the inductor and a cathode connected to an anode of the light emitting diode;
a switching element having one end connected to a cathode of the diode;
a current sensing resistor having one end connected to another end of the switching element and another end is grounded;
an RS flip-flop configured to generate a signal indicating an ON/OFF period of the switching element;
a frequency counter configured to input a clock signal of predetermined frequency and then count the input clock signal to be output as a counted value;
a frequency setting circuit where a particular switching frequency value is held;
a first comparator circuit configured to compare the counted value from the frequency counter and the switching frequency value, and then output a set signal to the RS flip-flop when the counted value reaches the switching frequency value;
a second comparator circuit configured to detect a current flowing through the current sensing resistor during an ON period of the switching element, and then compare the detected current with a peak current value, the second comparator circuit further configured to output a reset signal to the RS flip-flop when the detected current reaches the peak current value;
an A/D conversion circuit configured to detect the current flowing through the current sensing resistor during the ON period of the switching element, and then convert the detected current into digital data; and
an arithmetic control means for calculating a lower limit of the detected current for providing a timing of switching the switching element from OFF to ON based on data of at least two points of the detected current output from the A/D conversion circuit, wherein
the arithmetic control means calculates the lower limit using the following equation:

$$Y0=((y0+y1)/2)-(y1-y0)=(3y0-y1)/2,$$

where Y0 is the lower limit; and y0 and y1 are respectively the currents flowing through the current sensing resistor in time points t0 and t1 during the ON period of the switching element, wherein
the arithmetic control means determines whether it is in a discontinuous mode on the basis of the lower limit of the detected current calculated by the arithmetic control means, and then determines that it is in the discontinuous mode when the lower limit of the detected current is a negative value, wherein
the arithmetic control means increases a frequency of the switching element by changing the switching frequency value held in the frequency setting circuit when determining that it is in the discontinuous mode.

2. The switching current control circuit according to claim 1, wherein a value to the frequency of the switching element is returned to an initial setting frequency value, when the lower limit of the detected current becomes equal to or greater than 0 and further exceeds a predetermined value by increasing the frequency of the switching element.

3. The switching current control circuit according to claim 1, wherein the frequency of the switching element is decreased, when determining that it is in the continuous mode based on the lower limit of the detected current, and a length of the ON period of the switching element is equal to or lower than a length of a switching noise generating period occurring at the time when the switching element is switched from ON to OFF.

4. The switching current control circuit according to claim 1, wherein the A/D conversion circuit is composed two sample hold circuits and one A/D converter.

5. The switching current control circuit according to claim 1, wherein the switching current control circuit itself is connected to an LED via a switching element and an inductor, and
the switching current control circuit controls so that an average current flowing through the LED becomes constant even when the frequency of the switching element is increased.

6. An LED dimmer system comprising the switching current control circuit according to any one of claim 1, 2, 3, 4, or 5, the LED dimmer system performing dimming of an LED, the LED comprising the light emitting diode (52), the LED dimmer system comprising:
a bridge type full wave rectifying circuit connected to one end side of an AC power supply;
a triac dimmer connected to other end side of the AC power supply;

a bleeder resistor connected to an output side of the triac dimmer; and a bleeder control unit configured to control a current flowing through the bleeder resistor wherein an output of the bridge type full wave rectifying circuit (31) is used for the DC power supply in the switching current control circuit (100).

7. The LED dimmer system according to claim 6, the bleeder control unit controls to supply a predetermined holding current for holding ON state to the triac dimmer via the bleeder resistor.

8. The LED dimmer system according to claim 6 further comprising a control resistor connected to the bleeder resistor via the switching element; and a monitor resistor connected to the control resistor and the bridge type full wave rectifying circuit, wherein the bleeder control unit performs on/off control of the switching element in accordance with a value of a current flowing through the monitor resistor.

9. The LED dimmer system according to claim 6, wherein a current flowing through the bleeder resistor is controlled to be 20-50 mA.

10. The LED dimmer system according to claim 6 further comprising a switching unit for switching a first dimming mode for performing phase dimming using the triac dimmer, a second dimming mode for performing pulse width modulation dimming, and a third dimming mode for performing linear dimming using a variable resistor.

11. An LED illumination device comprising the LED dimmer system according to claim 6.

12. The LED illumination device according to claim 11 composed as a bulb type LED illumination device or a ceiling light type LED illumination device.

* * * * *